(12) United States Patent
Haneda

(10) Patent No.: US 8,383,484 B2
(45) Date of Patent: Feb. 26, 2013

(54) SEMICONDUCTOR DEVICE PRODUCTION METHOD

(75) Inventor: Masaki Haneda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/085,108

(22) Filed: Apr. 12, 2011

(65) Prior Publication Data
US 2012/0052645 A1    Mar. 1, 2012

(30) Foreign Application Priority Data

Aug. 24, 2010  (JP) .................................. 2010-187244

(51) Int. Cl.
*H01L 21/336* (2006.01)
(52) U.S. Cl. ................. 438/287; 438/785; 257/E21.409
(58) Field of Classification Search ........... 257/E21.051, 257/E21.177, E21.35, E21.4, E21.536, E21.598
See application file for complete search history.

(56) References Cited

U.S. PATENT DOCUMENTS

| | | | |
|---|---|---|---|
| 2007/0210354 A1 | 9/2007 | Nabatame et al. | |
| 2008/0067606 A1* | 3/2008 | Jung et al. | 257/369 |
| 2008/0224236 A1* | 9/2008 | Ren et al. | 257/407 |

FOREIGN PATENT DOCUMENTS

JP    2007-243009 A    9/2007

* cited by examiner

*Primary Examiner* — Cheung Lee
(74) *Attorney, Agent, or Firm* — Westerman, Hattori, Daniels & Adrian, LLP

(57) ABSTRACT

A semiconductor device production method includes: forming a gate insulating film on the p-type region of a semiconductor substrate; forming a first aluminum oxide film with an oxygen content lower than stoichiometric composition on the gate insulating film; forming a tantalum-nitrogen-containing film that contains tantalum and nitrogen on the first aluminum oxide film; forming an electrically conductive film on the tantalum-nitrogen-containing film; patterning the electrically conductive film to form a gate electrode; injecting n-type impurities into the p-type region using the gate electrode as a mask; and carrying out heat treatment after the formation of the tantalum-nitrogen-containing film.

20 Claims, 21 Drawing Sheets

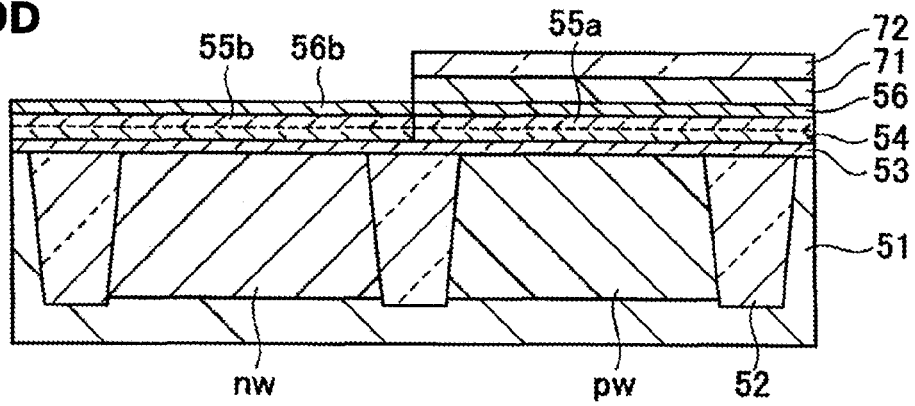
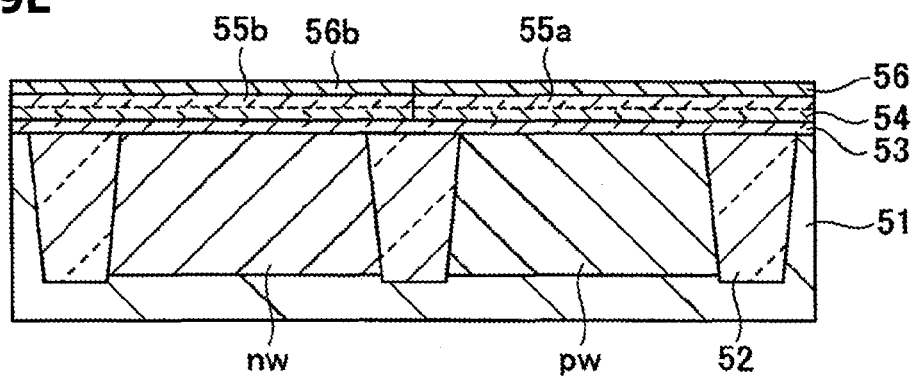
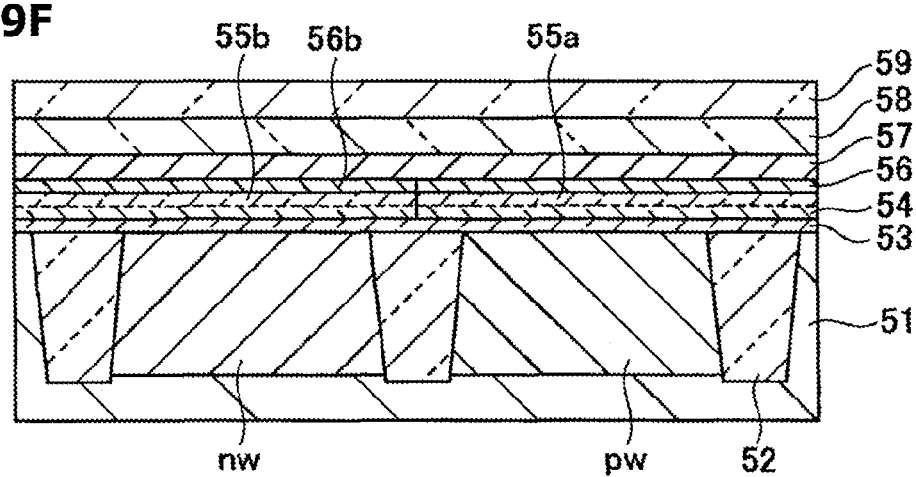

SEMICONDUCTOR DEVICE PRODUCTION METHOD

CROSS-REFERENCE TO RELATED APPLICATION

This application is based upon and claims the benefit of priority of the prior Japanese Patent Application No. 2010-187244, filed on Aug. 24, 2010, the entire contents of which are incorporated herein by reference.

FIELD

The embodiments discussed herein are related to a semiconductor device production method.

BACKGROUND

In MOS transistors composed of a high dielectric constant insulating film and a metal gate electrode, the threshold voltage is difficult to control. A threshold voltage control technique that uses a capping layer of a heterogeneous material provided between a high dielectric constant insulating film and a metal gate electrode has been developed (see, for instance, Japanese Unexamined Patent Publication (Kokai) No. 2007-243009).

SUMMARY

According to one aspect of the invention, a semiconductor device production method includes: forming a gate insulating film on the p-type region of a semiconductor substrate; forming a first aluminum oxide film with an oxygen content lower than stoichiometric composition on the gate insulating film; forming a tantalum-nitrogen-containing film that contains tantalum and nitrogen on the first aluminum oxide film; forming an electrically conductive film on the tantalum-nitrogen-containing film; patterning the electrically conductive film to form a gate electrode; injecting n-type impurities into the p-type region using the gate electrode as a mask; and carrying out heat treatment after the formation of the tantalum-nitrogen-containing film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9F are schematic cross sections illustrating major steps of the CMOS transistor production method according to Embodiment 4.

DESCRIPTION OF EMBODIMENTS

First, the production method for the semiconductor device according to Embodiment 1 of the invention is described. Embodiment 1 is for the preparation of an n-type MOS transistor. FIGS. 1A to 1J are schematic cross sections illustrating major steps of the n-type MOS transistor production method according to Embodiment 1.

Figure 1A:
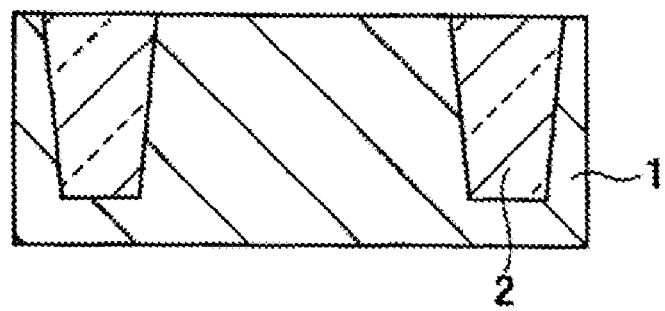
FIGS. 1A to 1J are schematic cross sections illustrating major steps of the n-type MOS transistor production method according to Embodiment 1.

See FIG. 1A. On a p-type silicon substrate 1, device separation insulating films 2 are formed by, for instance, shallow trench isolation (STI) to define active regions where n-type MOS transistors are to be formed.

Figure 1B:
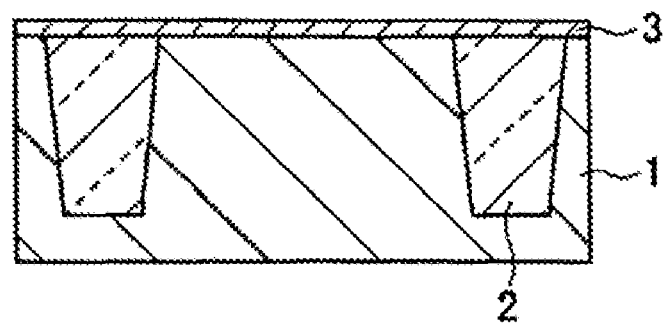

See FIG. 1B. On the silicon substrate 1, for instance, a silicon oxynitride film with a thickness of 0.3 nm to 1 nm (for instance, 0.7 nm) is grown by thermal oxynitridation using NO gas to form an insulating film underlayer 3 designed to constitute a laminated gate insulating film having a laminated structure composed of an insulating film underlayer and a high dielectric constant insulating film. Here, the insulating film underlayer 3 may be a silicon oxide film. Or, a silicon oxide film may be produced first, followed by plasma treatment in an atmosphere containing $N_2$ gas and then annealing at 750° C. to 1,100° C. to form a silicon oxynitride film.

Figure 1C:
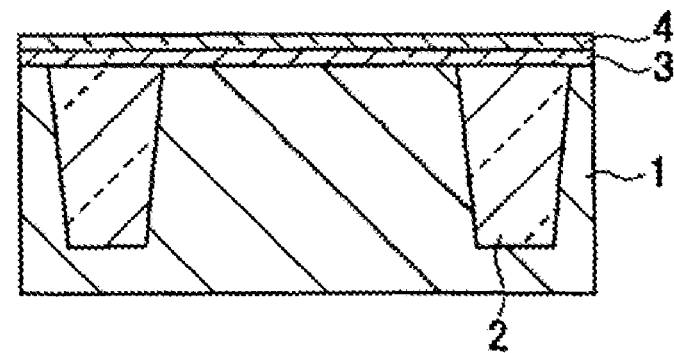

See FIG. 1C. On the insulating film underlayer 3, for instance, a hafnium oxide film with a thickness of 0.5 nm to 3 nm (for instance, 2 nm) is deposited by atomic layer deposition (ALD) to form the high dielectric constant insulating film 4 of the laminated gate insulating film. The "high dielectric constant insulating film" as referred to here is an insulating film of a dielectric material that has a higher dielectric constant than that of $SiO_2$ and contains Hf, Zr, or Ta, in addition to oxygen. Useful methods to produce a hafnium oxide film include chemical vapor deposition (CVD) and physical vapor deposition (PVD), in addition to ALD.

The production of the hafnium oxide film may be followed by heat treatment (for instance, for 5 seconds) at 500° C. to 1,050° C. (for instance, 850° C.) to condition the properties of the hafnium oxide film. Here, one or more of the group of Zr, Ti, Al, Si, Ta, La, Y, and Mg may be added to the hafnium oxide film as long as the threshold voltage can be controlled appropriately. It may also be nitrided by nitrogen plasma treatment and annealing at 750° C. to 1,100° C.

Figure 1D:
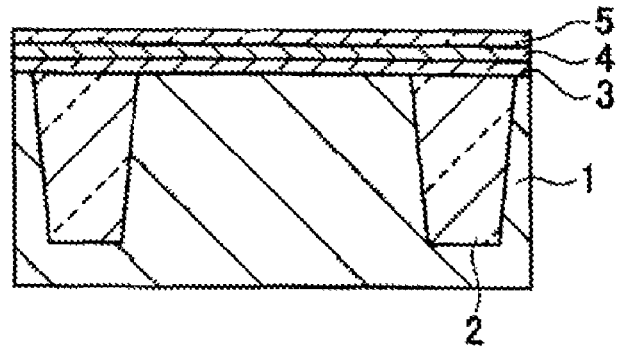

See FIG. 1D. On the high dielectric constant insulating film 4, for instance, an aluminum oxide film with a thickness of 0.3 nm to 1.0 nm (for instance, 0.5 nm) is deposited by ALD to form the aluminum oxide capping layer 5. For aluminum oxide $Al_2O_3$ with the stoichiometric composition, the Al:O ratio is 1:1.5. The aluminum oxide to be used as the aluminum oxide capping layer 5 according to Embodiment 1 is lower in oxygen content as compared with the stoichiometric composition, and has an Al:O ratio of, for instance, 1:1. Here, the useful methods to produce the aluminum oxide film include thermal CVD and PVD, in addition to ALD. ALD is helpful in adjusting the composition.

Figure 1E:
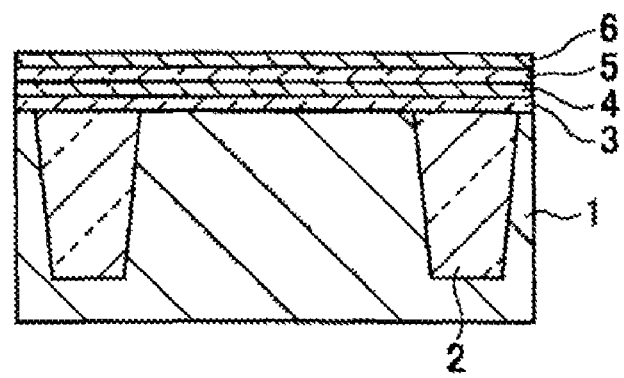

See FIG. 1E. On the aluminum oxide capping layer 5 with a low oxygen content, for instance, a tantalum nitride film with a thickness of 0.1 nm to 1.0 nm (for instance, 0.5 nm) is deposited by ALD to form a tantalum nitride capping layer 6. Here, the useful methods to produce the tantalum nitride film include thermal CVD and PVD, in addition to ALD.

Figure 1F:
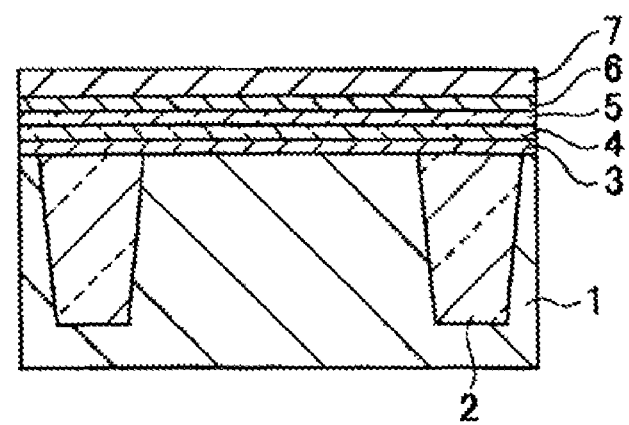

See FIG. 1F. On the tantalum nitride capping layer 6, for instance, a titanium nitride film with a thickness of 2 nm to 20 nm (for instance, 10 nm) is deposited by PVD to form a first gate conductive film 7. Specifically, the PVD conditions include, for instance, a substrate temperature of −30° C. to 400° C., a RF power of 2,000 W or less, a DC power of 50,000 W or less, and an atmosphere of $N_2$ alone or a gas mixture of Ar and $N_2$. Here, the useful methods to produce the titanium nitride film include ALD and CVD, in addition to PVD.

In addition to titanium nitride (TiN), various metal films are available as useful material for the first gate conductive film 7. They include, for instance, Ti, Hf, Al, TiTa, RuTa, TiSi, WN, TiAlN, TiSiN, TaSiN, TaN, NiSi, $NiSi_2$, W, $WSi_2$, TiN, $CoSi_2$, $MoSi_2$, ZrN, WSi, HfN, PtRa, Ir, TaCN, Mo, MoN, Ru, Pt, $Ni_3Si$, and Ni, which commonly may be used singly or in the form of a laminate of a combination thereof. Any of these materials may be used.

Figure 1G:
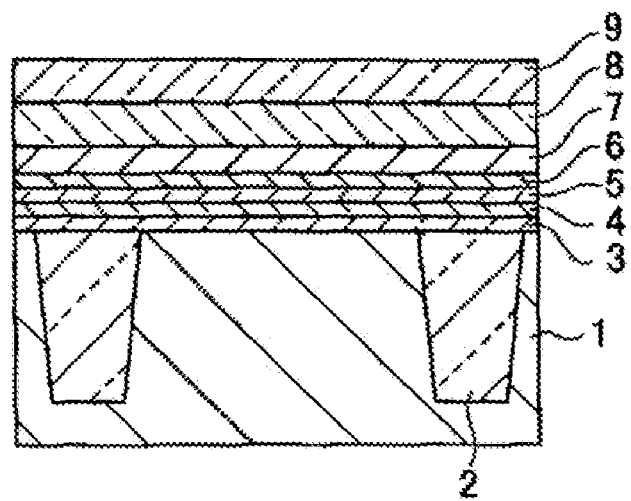

See FIG. 1G. On the first gate conductive film 7, for instance, a polysilicon film with a thickness of 10 nm to 100 nm (for instance, 50 nm) is deposited by thermal CVD to form a second gate conductive film 8. Here, the second gate conductive film 8 may be made of amorphous silicon, or, for instance, tungsten film instead of polysilicon film and amorphous silicon film.

In addition, on the second gate conductive film 8, for instance, a silicon nitride film with a thickness of 5 nm to 20 nm is deposited by CVD to form a hard mask film 9 to be used to pattern an insulation gate electrode. The production of the hard mask film 9 may be omitted and the insulation gate electrode may be patterned without a hard mask.

Figure 1H:
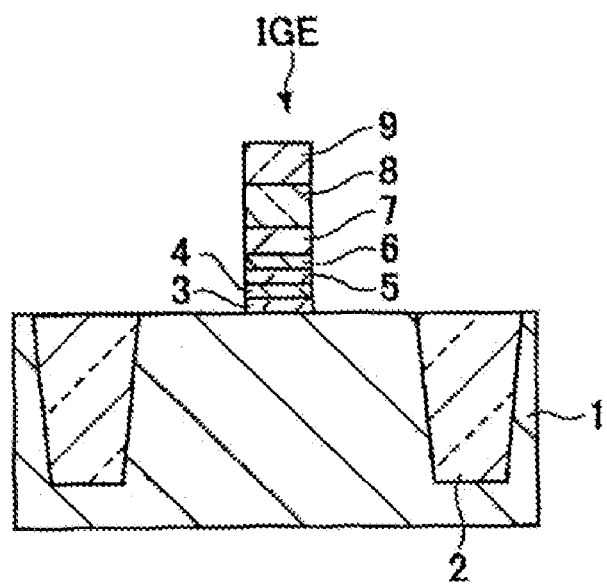

See FIG. 1H. The hard mask film 9, the second gate conductive film 8, the first gate conductive film 7, the tantalum nitride capping layer 6, the low-oxygen aluminum oxide capping layer 5, the high dielectric constant insulating film 4, and the insulating film underlayer 3 are etched to form an insulation gate electrode IGE.

The etching gas to be used may be, for instance, $CF_4$, $CH_3F$, Ar, and $O_2$ for a hard mask film 9 of silicon nitride, $CF_4$, $Cl_2$, and $N_2$ for a second gate conductive film 8 of polysilicon, $Cl_2$, $CF_4$, and $N_2$ for a first gate conductive film 7 of titanium nitride, and $BCl_3$ and Ar for a capping layer 6 of tantalum nitride, a capping layer 5 of aluminum oxide, a high dielectric constant insulating film 4 of hafnium oxide, and an insulating film underlayer 3 of silicon oxynitride.

Figure 1I:
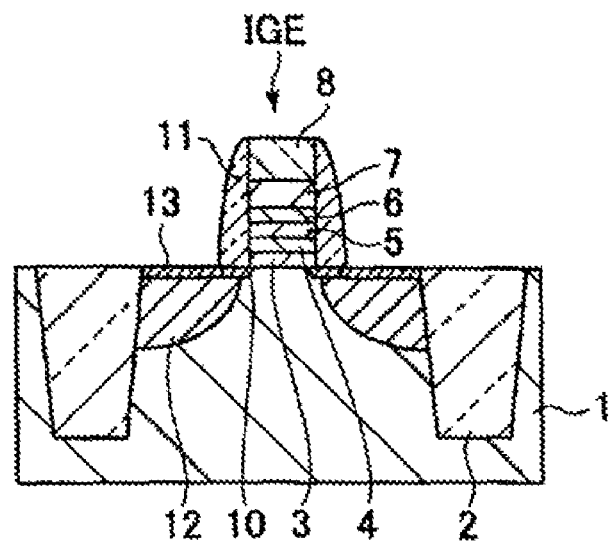

See FIG. 1I. Using the insulation gate electrode IGE as mask, n-type impurities are injected to form low concentration portions 10. To cover the insulation gate electrode IGE, for instance, a silicon nitride film with a thickness of 50 nm is deposited on the silicon substrate 1 by CVD, and this silicon nitride film is then anisotropically etched, leaving a side wall spacer 11 on the side face of the insulation gate electrode IGE. The hard mask film 9 on the second gate conductive film 8 is removed during the etching performed for the formation of the side wall spacer 11. Using the insulation gate electrode IGE and the side wall spacer 11 as mask, n-type impurities are injected to form high concentration source/drain portions 12.

Heat treatment is carried out to activate the impurities injected into the low concentration portions 10 and the high concentration source/drain portions 12. For instance, rapid thermal annealing (RTA) is carried out at a temperature above about 1,000° C. (for instance, at 1,050° C.). Silicide films 13 are then formed over the surface of the high concentration source/drain portions 12.

Figure 1J:
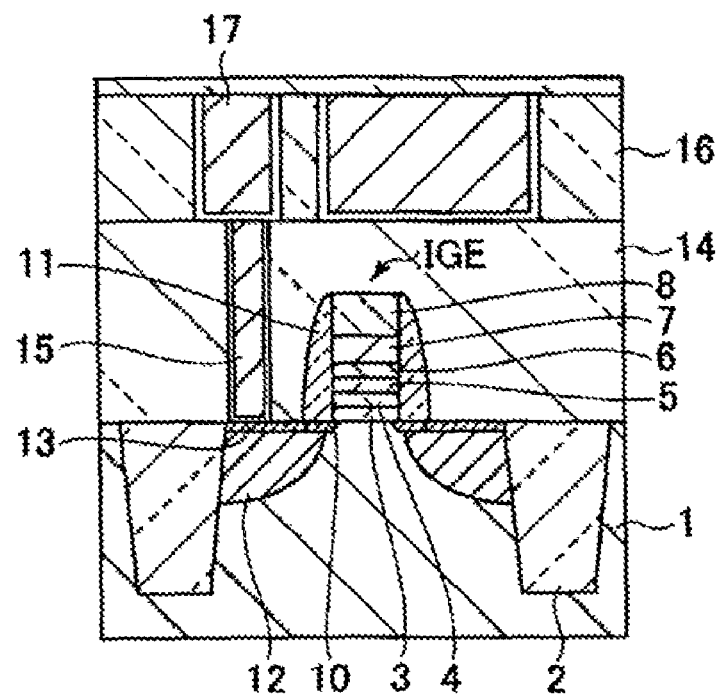

See FIG. 1J. To cover the insulation gate electrode IGE, for instance, a silicon oxide film is deposited on the silicon substrate 1 by thermal CVD or high density plasma CVD to form an interlayer insulating film 14. Various generally known low dielectric constant substances are available as material for the interlayer insulating film 14.

A contact hole to expose the source/drain portions 12 of the MOS transistor is formed through the interlayer insulating film 14, and then the contact hole is filled with tungsten, with a glue layer of Ti, TiN, or the like provided between them, to form a contact plug 15.

In addition, another interlayer insulating film 16 of, for instance, one of various generally known low dielectric constant materials, is formed on the interlayer insulating film 14. By the damascene process, copper is embedded in the interlayer insulating film 16, with a barrier metal film such as Ta, TaN, Ti, and TiN provided between them, to form an interconnect 17.

Subsequently, an upper interconnect structure is produced by one of various generally known techniques to form a multi-layered interconnect structure. In this way, the semiconductor device according to Embodiment 1 is produced.

In Embodiment 1, an n-type MOS transistor was produced by injecting n-type impurities into a p-type substrate. However, an n-type MOS transistor may be produced by forming p-type wells in an appropriate conductive semiconductor substrate, followed by injection of n-type impurities.

Described below are experiments designed to determine the function of the aluminum oxide capping layer and the tantalum nitride capping layer.

Figures 2A, 2B:
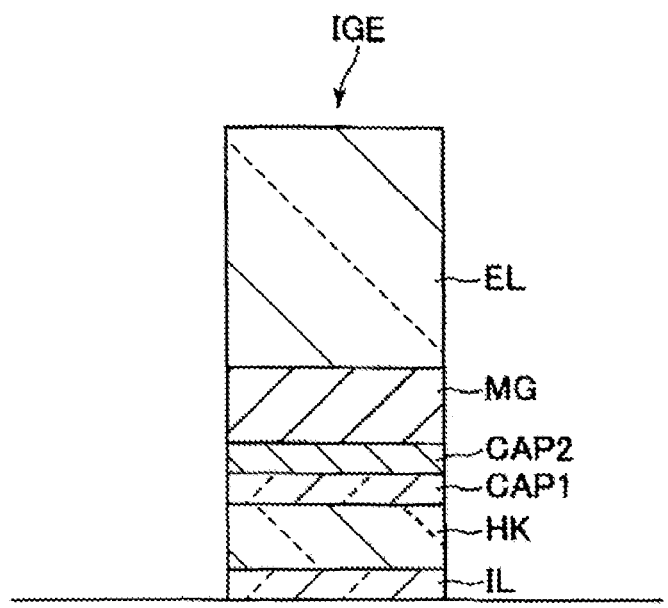
FIG. 2A is a schematic cross section of the insulation gate electrode.
FIG. 2B gives a table that lists experimental conditions for experiments designed to study the function of a capping layer.

FIG. 2A is a schematic cross section of the insulation gate electrode IGE, and FIG. 2B lists the experimental conditions. In this experiment, roughly the same steps as in Embodiment 1 were carried out to prepare five MOS transistor samples by using different materials as the capping layers CAP1 and CAP2 located between the high dielectric constant insulating film HK and the first gate conductive film MG in the insulation gate electrode IGE.

Silicon oxynitride (SiON) was used for the insulating film underlayer IL, and hafnium oxide ($HfO_2$) was used for the high dielectric constant insulating film HK. The production of the hafnium oxide film was followed by annealing at 850° C. for 5 seconds.

Subsequently, the aluminum oxide capping layer CAP1 was produced. For the aluminum oxide capping layer CAP1, aluminum oxide $Al_2O_3$ with the stoichiometric composition was used to prepare the samples 1 and 2, and low-oxygen aluminum oxide AlO with an Al:O ratio of 1:1 was used to prepare the samples 3 and 4. Both the $Al_2O_3$ films and AlO films were produced by ALD up to a film thickness of 0.5 nm. The sample 5 did not have an aluminum oxide capping layer CAP1.

The production of the aluminum oxide capping layer CAP1 was followed by mixing annealing in a $N_2$ atmosphere at 1,050° C. for 5 seconds. By the mixing annealing, substances in the aluminum oxide capping layer CAP1 are diffused into the high dielectric constant insulating film HK. The sample 5 that did not contain an aluminum oxide capping layer CAP1 was subjected to heat treatment under equivalent conditions to those for the mixing annealing of the sample 1 to 4 that had an aluminum oxide capping layer CAP1 (hereafter, this heat treatment is also called mixing annealing).

After the mixing annealing, a tantalum nitride capping layer CAP2 was produced in the samples 2, 4, and 5. The tantalum nitride (TaN) film was produced by ALD up to a film thickness of 0.5 nm. Such a tantalum nitride capping layer CAP2 was not produced in the samples 1 and 3.

The first gate conductive film MG was made of titanium nitride (TiN), and the second gate conductive film EL was made of polysilicon (Poly-Si). The formation of the second gate conductive film EL was followed by patterning and formation of the insulation gate electrode IGE, formation of the side wall space, injection of impurities, and annealing for impurity activation to prepare a MOS transistor. The annealing for impurity activation was carried out at 1,050° C.

An n-type MOS transistor and a p-type MOS transistor were prepared using each of the samples 1 to 5 that contained different capping layers. Embodiment 1 corresponds to the sample 4, which is produced by using an aluminum oxide capping layer CAP1 of low-oxygen AlO and forming a tantalum nitride capping layer CAP2 to produce an n-type MOS transistor. It is noted that mixing annealing is not included in the production steps of Embodiment 1.

Described below is the effect of capping layers on the threshold voltage shift of a MOS transistor. In a p-type MOS transistor, a negative gate voltage is applied, and therefore, a positive shift reduces the threshold voltage. In an n-type MOS transistor, on the contrary, a positive gate voltage is applied, and therefore, a negative shift reduces the threshold voltage. From the viewpoint of reduction in the threshold voltage, a positive shift is preferred in a p-type MOS transistor while a negative shift is preferred in an n-type MOS transistor.

Figure 3:
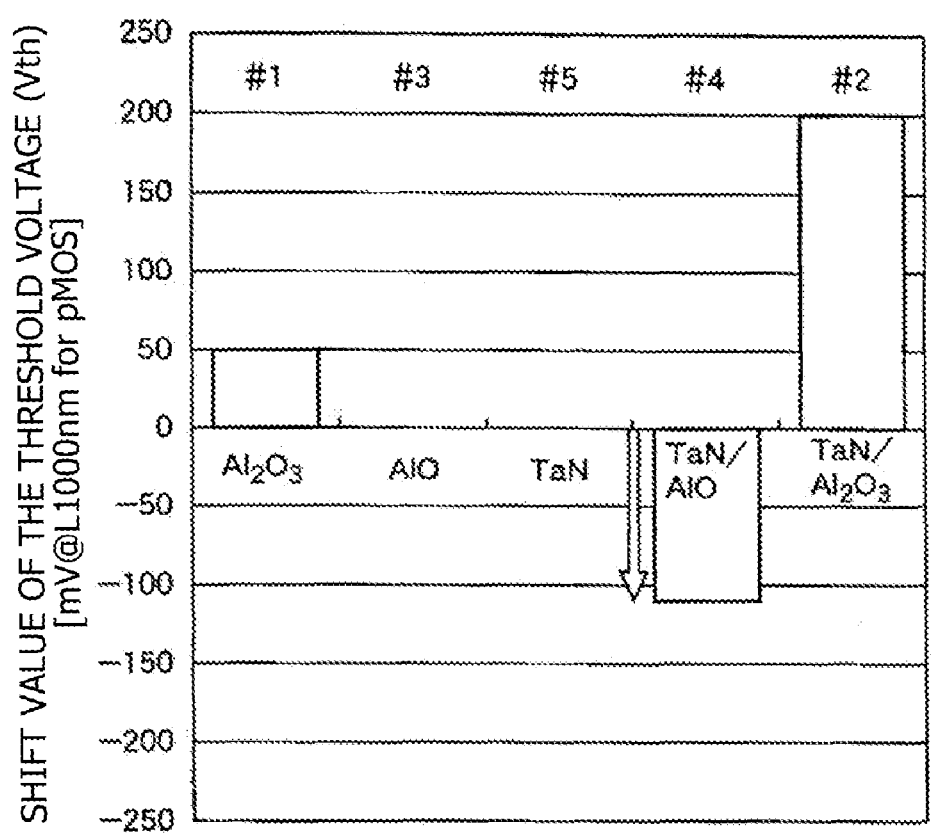
FIG. 3 is a graph that illustrates the effect of various capping layers on the threshold voltage shift.

FIG. 3 is a graph that illustrates the effect of various capping layers on the shift of the threshold voltage (Vth) in the samples. The sample 1 represented as $Al_2O_3$, the sample 2 as $TaN/Al_2O_3$, the sample 3 as AlO, the sample 4 as TaN/AlO, and the sample 5 as TaN. Their shift values are compared on the basis of the threshold voltage of the capping-layer-free structure, in which the first gate conductive film MG is formed directly on the high dielectric constant insulating film HK. Results for the p-type MOS transistor are illustrated. The gate length was 1,000 nm.

The sample 1 ($Al_2O_3$) exhibited a positive shift of 50 mV. The sample 3 (AlO) exhibited little shift in the threshold voltage. It was found that the samples with only the aluminum oxide capping layer CAP1 exhibited a positive shift when aluminum oxide with the stoichiometric composition was used, while they exhibited little shift when low-oxygen aluminum oxide was used.

In the sample 1, mixing annealing appears to contribute to the threshold voltage shift. For the sample 3, on the other hand, it is seen that mixing annealing does not cause a significant shift in the threshold voltage.

A positive shift of about 200 mV took place in the sample 2 ($TaN/Al_2O_3$). For the capping layer CAP1 made of aluminum oxide with the stoichiometric composition, results suggest that the tantalum nitride capping layer CAP2 formed on top of the former can further increase the positive shift.

The sample 4 (TaN/AlO) exhibited a negative shift of about 110 mV. For the capping layer CAP1 of low-oxygen aluminum oxide, it is seen that the tantalum nitride capping layer CAP2 formed on top of the former can produce a negative shift.

In both the sample 2 and the sample 4, the formation of the tantalum nitride capping layer CAP2 is followed by annealing for impurity activation, and this heat treatment appears to allow the tantalum nitride capping layer CAP2 to contribute to the threshold voltage shift as discussed later.

In the sample 5 (TaN), there was little shift in the threshold voltage. Results suggest that without the aluminum oxide capping layer CAP1, the tantalum nitride capping layer CAP2 alone may not bring about a shift in the threshold voltage.

From the above discussion, it can be concluded that a capping layer structure consisting of a tantalum nitride capping layer formed on top of a low-oxygen aluminum oxide capping layer, as in the sample 4, can effectively give rise to a negative shift in the threshold voltage.

This capping layer structure is adopted in the n-type MOS transistor production method of Embodiment 1. It was also found that in the capping layer of low-oxygen aluminum oxide, mixing annealing may not have a significant effect on the threshold voltage shift. Based on these results, the mixing annealing step is excluded in Embodiment 1.

Comparison between the sample 4 (TaN/AlO) and the sample 2 ($TaN/Al_2O_3$) suggests that the low oxygen content in the aluminum oxide capping layer led to the negative shift in the threshold voltage. A measure of oxygen composition relative to aluminum composition would be the stoichiometry. It is considered preferable that the ratio of the oxygen content to the aluminum content is at least less than 1.5 to realize a negative shift. It may be more preferable that the ratio of the oxygen content to the aluminum content is, for instance, 0.7 to 1.2, as values in the vicinity of those used in the above experiments.

To cause a positive shift in the threshold voltage, on the other hand, it is preferable to use a capping layer made of aluminum oxide with the stoichiometric composition or further add a tantalum nitride capping layer on top of the former capping layer, as in the sample 1 or the sample 2. The oxygen content in aluminum oxide may not necessarily be in strict conformity with the stoichiometric composition, but may be in the neighborhood of the stoichiometric composition. Thus, for instance, the ratio of the oxygen content to the aluminum content may be 1.4 to 1.6.

The present inventor made further examinations on the changes in other physical quantities that can result from variations in the threshold voltage shift caused by a tantalum nitride capping layer to study factors in the effect of the tantalum nitride capping layer on the threshold voltage shift.

Figure 4:
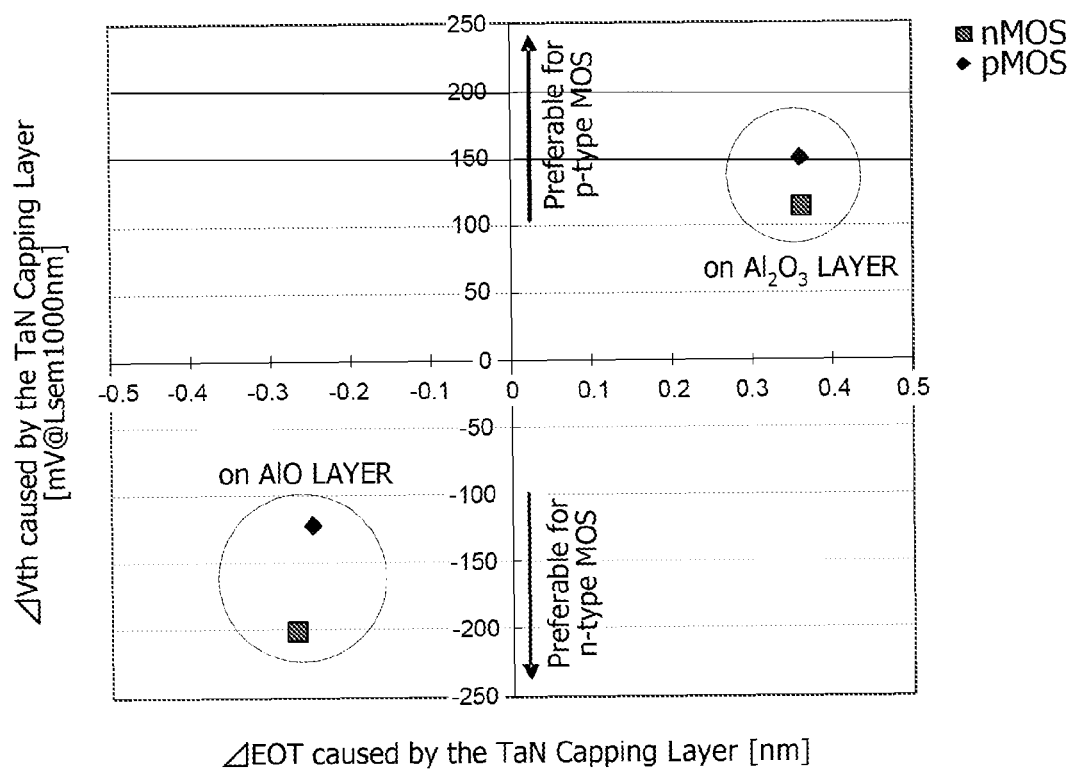
FIG. 4 is a graph that illustrates relations between the threshold voltage shift and EOT of the insulation gate electrode for different tantalum nitride capping layers.

FIG. 4 is a graph illustrating changes in the equivalent oxide thickness (EOT) of the insulation gate electrode with the threshold voltage shift caused by the tantalum nitride capping layer in the sample 2 ($TaN/Al_2O_3$) and the sample 4 (TaN/AlO). FIG. 4 illustrates the difference in the threshold voltage shift and EOT between cases with two capping layers and with the aluminum oxide alone, i.e. difference between the above samples and the samples 1 and 3. The results given in the circle of "on $Al_2O_3$ layer" are from the sample 2, and those in the circle of "on AlO layer" are from the sample 4. Results obtained from an n-type MOS transistor and a p-type MOS transistor are described.

In both the n-type and p-type MOS transistors, a positive shift in the threshold voltage took place in the sample 2, and a negative shift in the threshold voltage took place in the sample 4. This indicates that the conductivity type of the MOS transistor may have no effect on the direction of the threshold voltage shift.

In the sample 2, there is a tendency that the threshold voltage shifts toward the positive direction and the EOT increases. In the sample 4, on the other hand, the tendency is that the threshold voltage shifts toward the negative direction and the EOT decreases.

Figure 5:
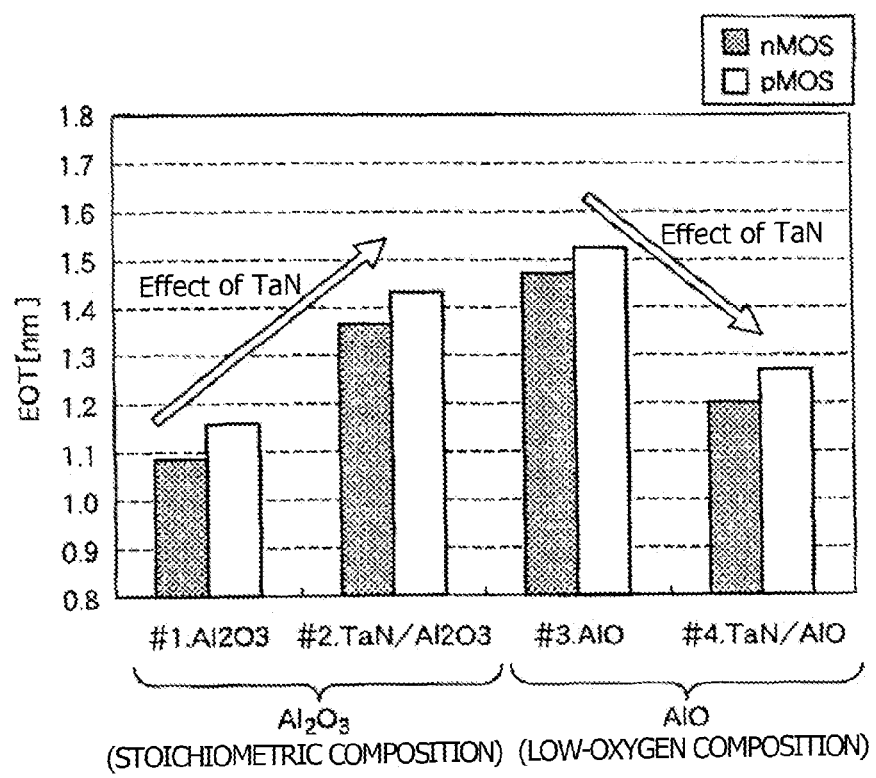
FIG. 5 is a graph that illustrates the EOT of different insulation gate electrodes.

FIG. 5 is a graph illustrating changes in the EOT of the insulation gate electrode in the samples 1 to 4. Results from an n-type MOS transistor and a p-type MOS transistor are given.

As described above with reference to FIG. 4, the tantalum nitride capping layer causes the EOT to increase in the case where a capping layer of aluminum oxide with the stoichiometric composition is used (samples 1 and 2), while the tantalum nitride capping layer causes the EOT to decrease in the case where a capping layer of low-oxygen aluminum oxide is used (samples 3 and 4).

It is considered that the increase in the EOT is the result of, for instance, an increase in the thickness of the gate insulating film or a decrease in the dielectric constant, and on the other hand, the decrease in the EOT is the result of, for instance, a decrease in the thickness of the gate insulating film or an increase in the dielectric constant.

Figure 6:
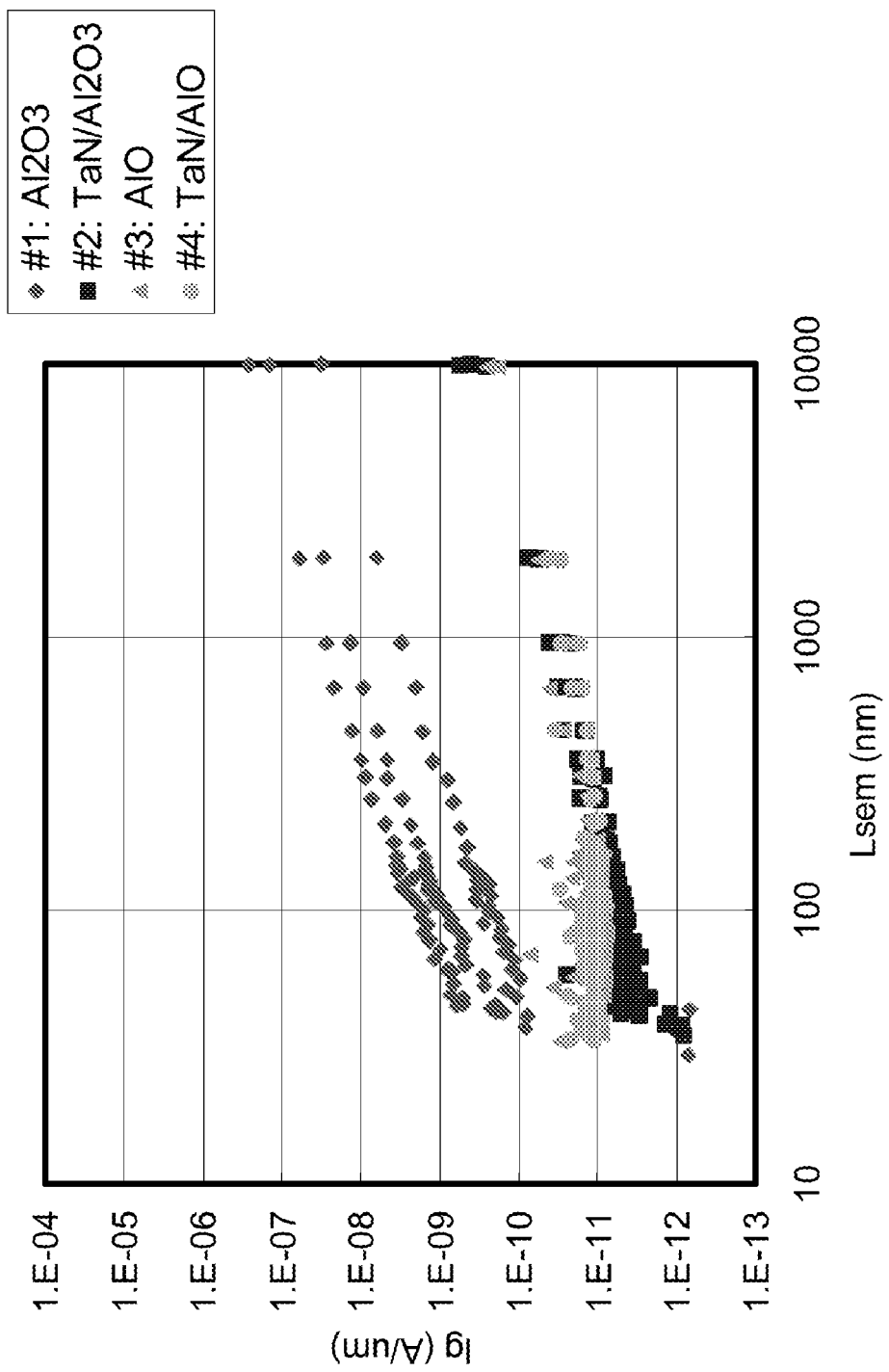
FIG. 6 is a graph that illustrates relations between the leak current from an insulation gate electrode and its gate length.

FIG. 6 is a graph illustrating the relation between the leak current (Ig) in the insulation gate electrode and the gate length (Lsem) for the samples 1 to 4. As seen from comparison between the sample 1 and the sample 2, when used in combination with a capping layer of aluminum oxide with the stoichiometric composition, a tantalum nitride capping layer tends to act to decrease the leak current.

From comparison between the sample 3 and the sample 4, on the other hand, it is seen that the formation a tantalum nitride capping layer tends to have little effect on the leak current when combined with a capping layer of low-oxygen aluminum oxide.

Summarizing the above results, it can be concluded that when a capping layer of aluminum oxide with the stoichiometric composition is used, the tantalum nitride capping layer tends to act to shift the threshold voltage further in the positive direction, increase the EOT, and decrease the leak current.

When a capping layer of low-oxygen aluminum oxide is used, on the other hand, the tantalum nitride capping layer tends to act to shift the threshold voltage further in the negative direction, decrease the EOT, and has little effect on the leak current.

Discussed below are the factors in the experiment results obtained above. At present, there is no theory developed to interpret all the experiment results described above, and the inventor can only describe a hypothesis below.

When a capping layer of aluminum oxide with the stoichiometric composition was used, the tantalum nitride capping layer tended to act to increase the EOT, and decreased the leak current. This appears to suggest an increase in the thickness of the gate insulating film.

However, the tantalum nitride capping layer is a metal film, and simply adding the tantalum nitride capping layer does not increase the thickness of the gate insulating film. It is noted that the aluminum oxide capping layer is also considered a gate insulating film.

As a likely hypothesis, it is inferred that the heat treatment following the formation of the tantalum nitride capping layer (referred to as annealing for impurity activation in the experiments here) allows the oxygen in the aluminum oxide capping layer to work to oxidize the tantalum nitride, leading to the production of tantalum oxynitride, which is an insulator. This may increase the thickness of the gate insulating film.

Tantalum oxynitride is of the oxygen vacancy type, and oxygen vacancies in the tantalum oxynitride film diffuse into the aluminum oxide capping layer to cause oxygen to move from the aluminum oxide capping layer into the tantalum oxynitride film.

In the aluminum oxide capping layer, positive charges may be produced as oxygen is removed. Since $Al_2O_3$ is of the Schottky defects type, negative charges may be produced to pair with the positive charge. There is a possibility that negative charges produced in the aluminum oxide capping layer in this way is causing a positive shift in the threshold voltage.

In cases where a capping layer of low-oxygen aluminum oxide is used, on the other hand, the tantalum nitride capping layer tends to act to decrease the EOT, but the leak current undergoes little changes rather than increases. This considered to suggest that the dielectric constant of the gate insulating film has increased, rather than that the gate insulating film has become thinner.

In this case, the aluminum oxide capping layer is of a low oxygen type, and it is inferred that the tantalum nitride may not be oxidized, causing no increase in the thickness of the gate insulating film. In this case, furthermore, nitrogen in the tantalum nitride released into the gate insulating film located below can work to nitride the gate insulating film, leading an increase in the dielectric constant of the gate insulating film. Furthermore, it can be considered that though not forming an oxide, the tantalum nitride captures oxygen to reduce the low-oxygen aluminum oxide. There is a possibility that this causes a decrease in the thickness of the aluminum oxide film, making the gate insulating film slightly thinner.

The discharge of nitrogen from the tantalum nitride and the reduction of the low-oxygen aluminum oxide are considered to result from the heat treatment following the formation of the tantalum nitride capping layer (referred as annealing for impurity activation in the experiments here).

Positive charges will be produced as the low-oxygen aluminum oxide is reduced to release oxygen. There is a possibility that the threshold voltage shifts in the negative direction as a result of positive charges being produced in the aluminum oxide capping layer.

It is noted that these mechanisms are only a hypothesis set up to interpret all these experimental results, and are not intended to deny other mechanisms.

Based on these experimental results, the present inventor consider it preferable that the aluminum oxide capping layer is made of aluminum oxide with an oxygen content at least lower than the stoichiometric composition, and heat treatment is carried out after the formation of the tantalum nitride capping layer to cause a negative shift in the threshold voltage.

Instead of TaN, the tantalum nitride capping layer may be, for instance, of a Ta—N alloy that is in a bond state different from TaN. If containing at least tantalum and nitrogen, a metal film can serve as the capping layer to be formed on a low-oxygen aluminum oxide capping layer.

It is preferable that a capping layer in the form of such a metal film containing tantalum and nitrogen is heat-treated in the temperature range of, for instance, 850° C. to 1,100° C. This heat treatment may be other forms of thermal processing such as annealing for impurity activation as described above.

Figure 7A:
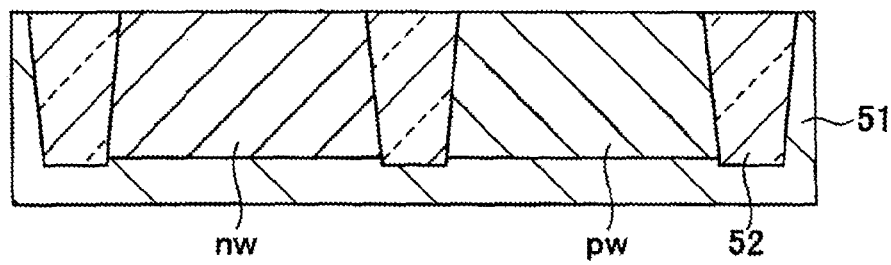
FIGS. 7A to 7U are schematic cross sections illustrating major steps of the CMOS transistor production method according to Embodiment 2.

Described below is the semiconductor device production method according to Embodiment 2. In Embodiment 2, an n-type MOS transistor and a p-type MOS transistor are formed in separate regions in producing CMOS transistors. FIGS. 7A to 7U are schematic cross sections illustrating major steps of the CMOS transistor production method according to Embodiment 2.

See FIG. 7A. On the silicon substrate 51, a device separation insulating film 52 of, for instance, STI is prepared to define active regions where n-type and p-type MOS transistors are to be formed. A p-type well pw is produced by injecting p-type impurities into the active region where an n-type MOS transistor is to be formed, while an n-type well nw is produced by injecting n-type impurities into the active region where a p-type MOS transistor is to be formed.

Figure 7B:
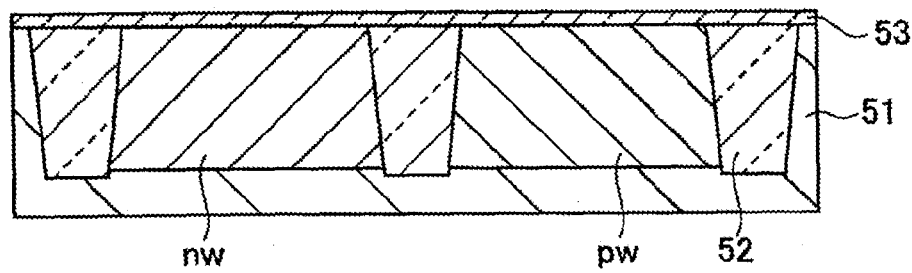

See FIG. 7B. An insulating film underlayer 53 is formed on the silicon substrate 51 by the similar procedure as for producing the insulating film underlayer 3 of Embodiment 1.

Figure 7C:
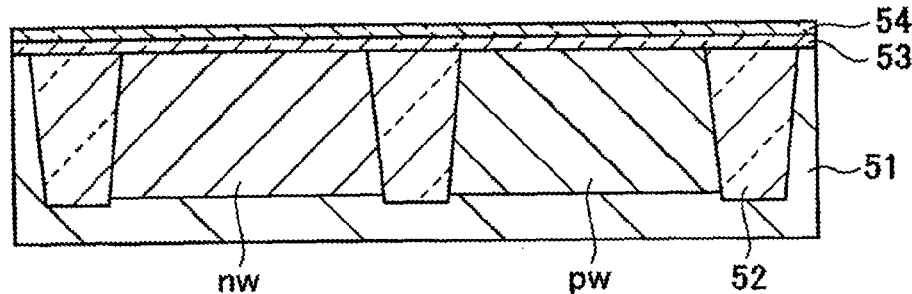

See FIG. 7C. A high dielectric constant insulating film 54 is formed on the insulating film underlayer 53 by the similar procedure as for producing the high dielectric constant insulating film 4 of Embodiment 1.

Figure 7D:
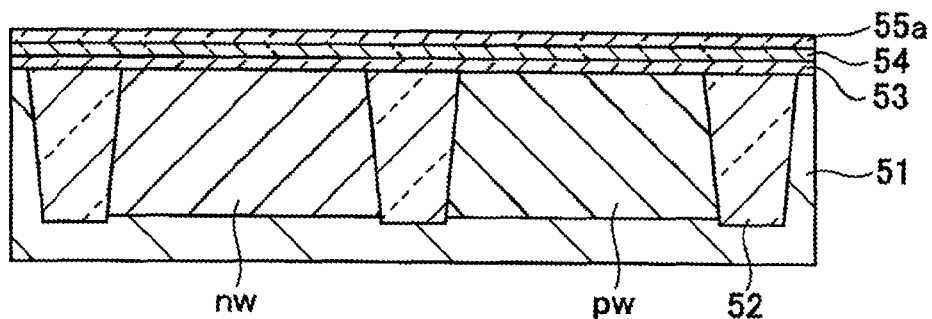

See FIG. 7D. On the high dielectric constant insulating film 54, a low-oxygen aluminum oxide cappaing layer 55a with an Al:O ratio of, for instance, 1:1 is formed by the similar procedure as for producing the low-oxygen aluminum oxide capping layer 5 of Embodiment 1.

Figure 7E:
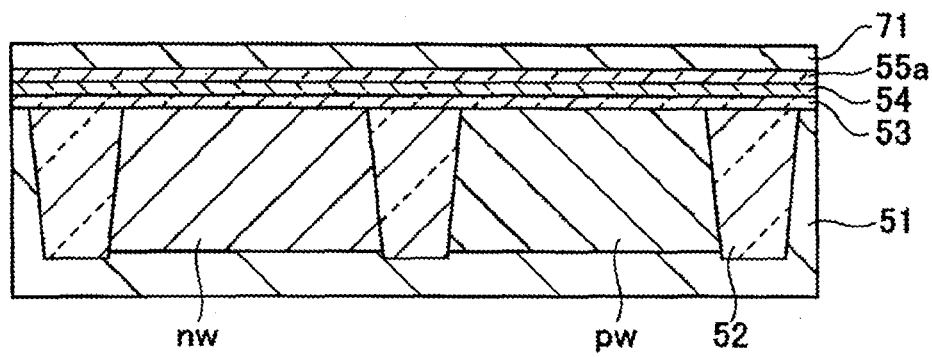

See FIG. 7E. On the low-oxygen aluminum oxide capping layer 55a, for instance, a titanium nitride film with a thickness of 30 nm is deposited by PVD to form a hard mask film 71.

Figure 7F:
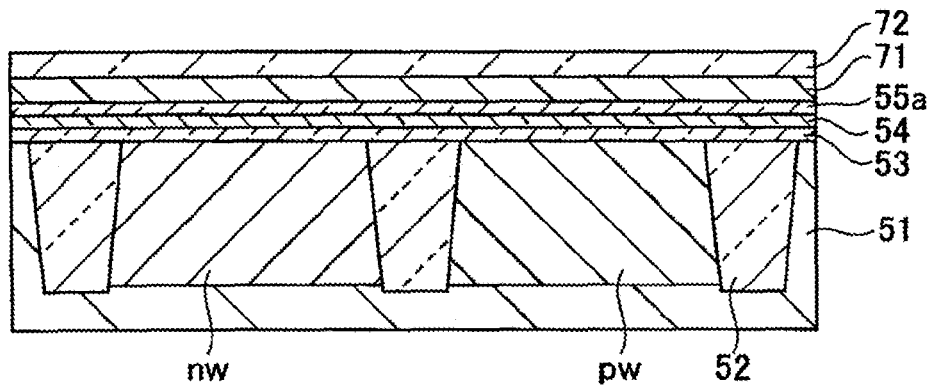

See FIG. 7F. On the hard mask film 71, for instance, a silicon nitride film with a thickness of 20 nm is deposited by CVD to form a hard mask film 72.

Figure 7G:
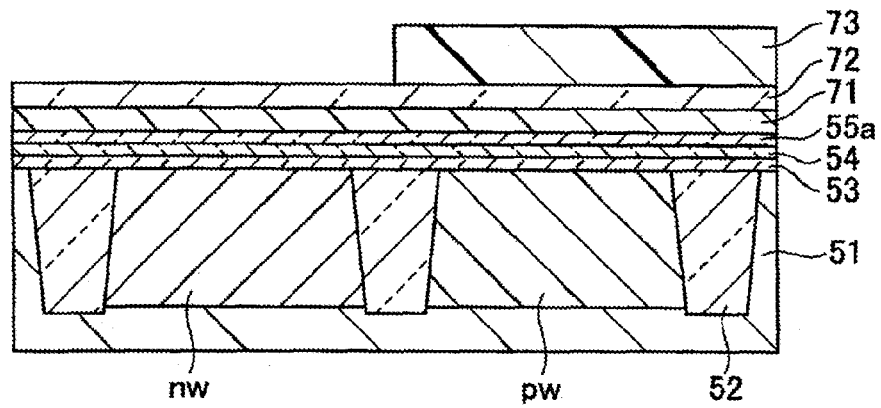

See FIG. 7G. On the hard mask film 72, a resist mask 73 is deposited to cover the region where an n-type MOS transistor is to be formed while exposing the region where a p-type MOS transistor is to be formed.

Figure 7H:
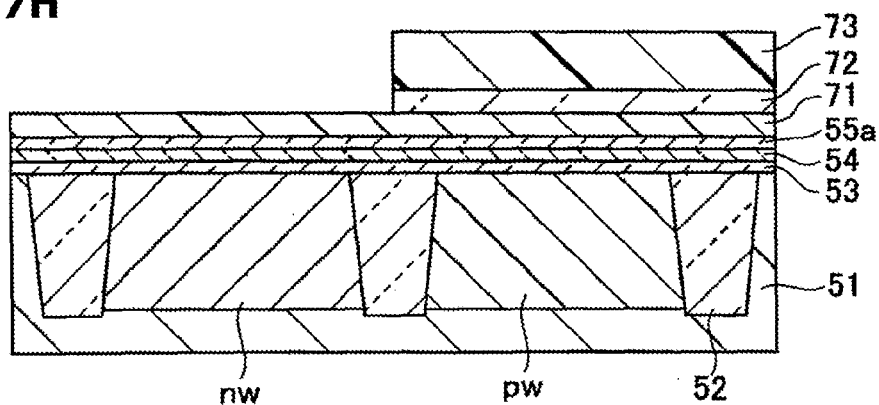

See FIG. 7H. Using the resist mask 73 as mask, the hard mask film 72, which is made of silicon nitride, is etched with, for instance, $CF_4$, $CH_3F$, Ar, and $O_2$.

Figure 7I:
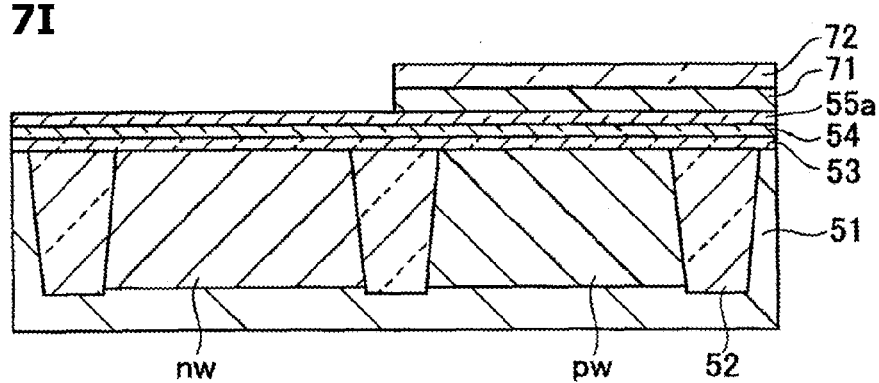

See FIG. 7I. In addition, using the hard mask film 72 as mask, the hard mask film 71, which is made of titanium nitride, is etched by, for instance, processing with a hydrogen peroxide solution and rinsing in water. The resist mask 73 is removed.

Figure 7J:
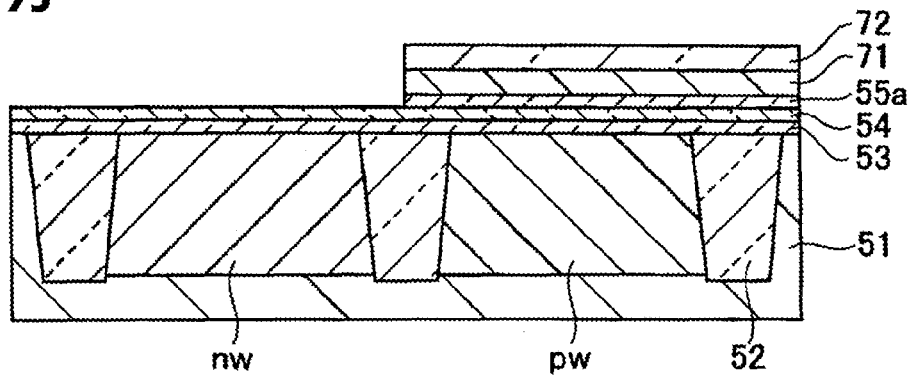

See FIG. 7J. Using the hard mask films 72 and 71 as mask, the low-oxygen aluminum oxide capping layer 55a in the p-type MOS transistor region is etched by, for instance, processing with a mixture liquid of sulfuric acid and a hydrogen peroxide solution (SPM) and rinsing in water.

Figure 7K:
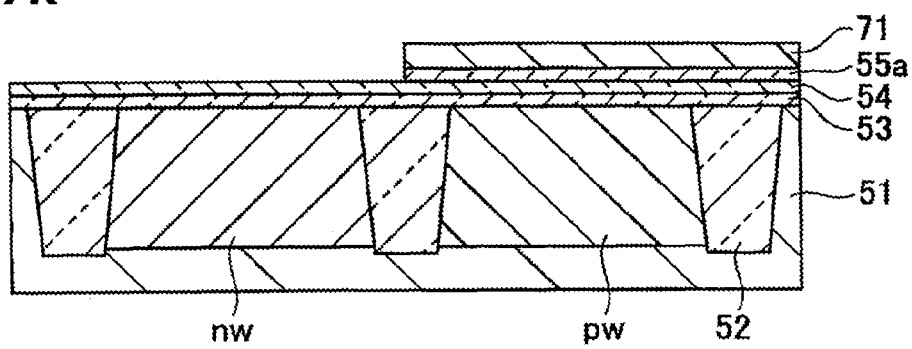

See FIG. 7K. The hard mask film 72 is removed by, for instance, processing with diluted hydrofluoric acid and rinsing in water.

Figure 7L:
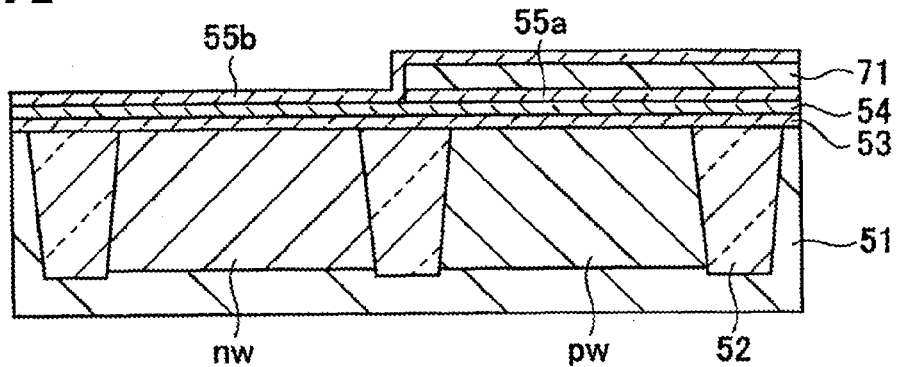

See FIG. 7L. On the high dielectric constant insulating film 54 exposed in the p-type MOS transistor region, for instance, an aluminum oxide capping layer 55b with the stoichiometric composition with a thickness of 0.3 nm to 1.0 nm (for instance, 0.5 nm) is formed by ALD. In the n-type MOS transistor region, the aluminum oxide capping layer 55b with the stoichiometric composition is formed on the hard mask film 71.

Figure 7M:
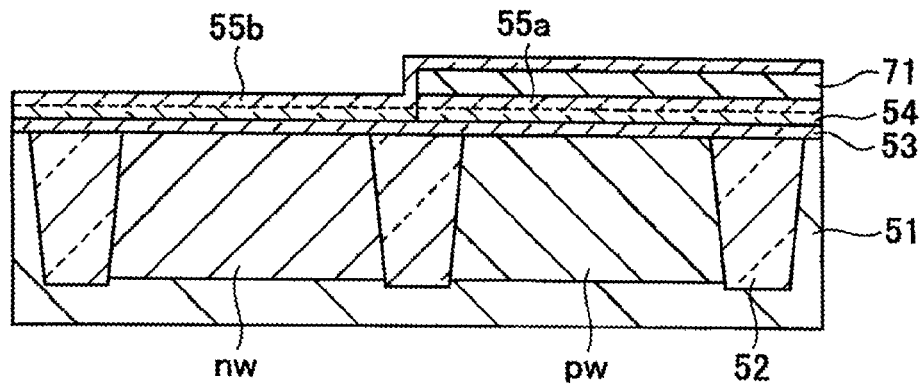

See FIG. 7M. Mixing annealing is carried out in, for instance, a $N_2$ atmosphere at 750° C. to 1,100° C.

Figure 7N:
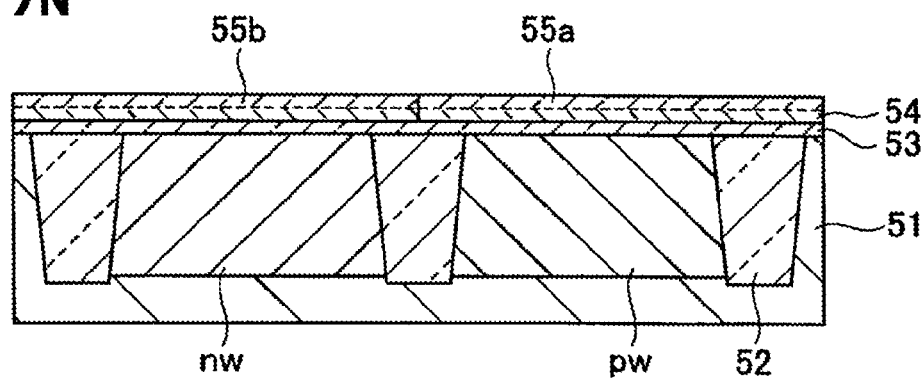

See FIG. 7N. The aluminum oxide capping layer 55b with the stoichiometric composition and the hard mask film 71 in the n-type MOS transistor region are removed, by processing with SPM and rinsing in water. In this way, a low-oxygen aluminum oxide capping layer 55a can be formed in the n-type MOS transistor region, and an aluminum oxide capping layer 55b with the stoichiometric composition is formed separately in the p-type MOS transistor region.

Here, in the p-type MOS transistor region, the aluminum oxide capping layer 55b existing on the high dielectric constant insulating film 54 is also etched slightly. However, the aluminum oxide capping layer 55b in this portion is not removed completely because it has been diffused by mixing annealing into the high dielectric constant insulating film 54 and sintered at the high temperature during the mixing annealing.

Figure 7O:
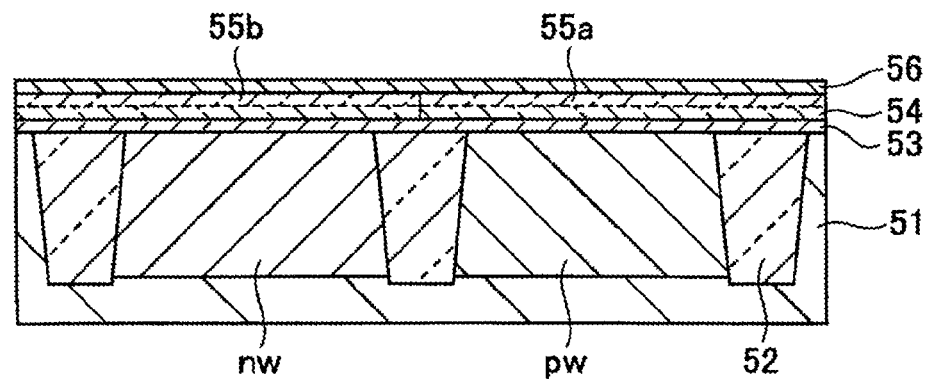

See FIG. 7O. On the aluminum oxide capping layers 55a and 55b, a tantalum nitride capping layer 56 is formed by the similar procedure as for producing the tantalum nitride capping layer 6 of Embodiment 1.

Figure 7P:
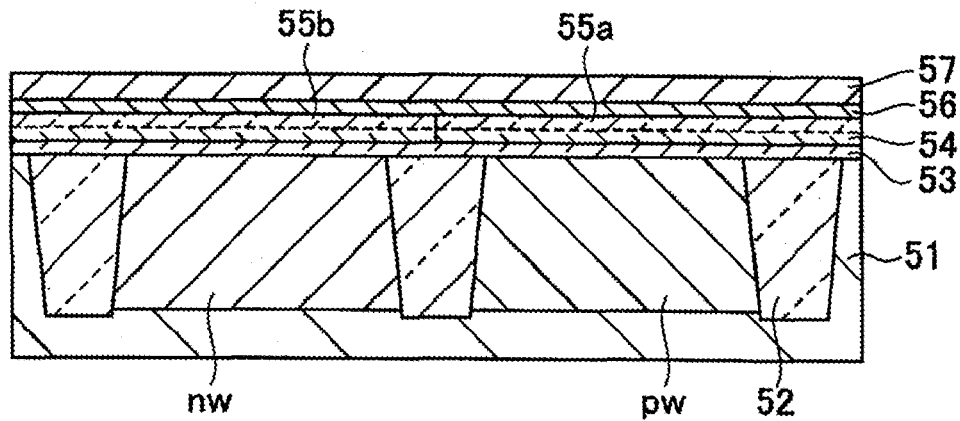

See FIG. 7P. On the tantalum nitride capping layer 56, a first gate conductive film 57 is formed by the similar procedure as for producing the first gate conductive film 7 of Embodiment 1.

Figure 7Q:
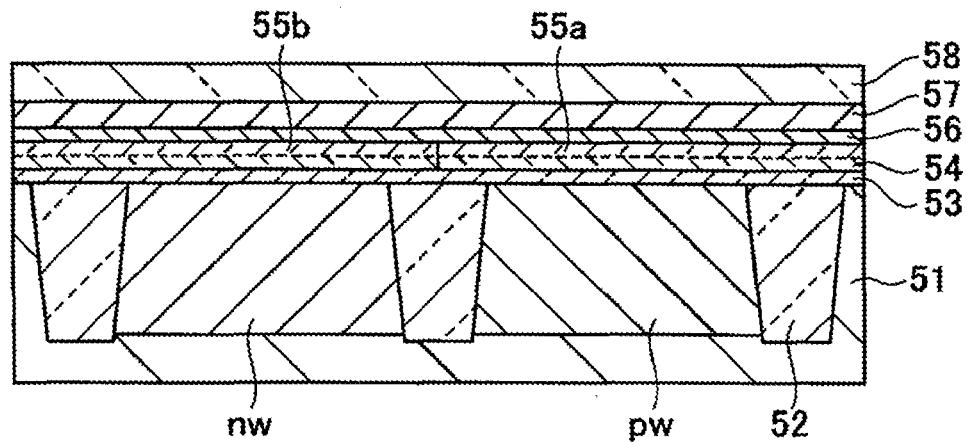

See FIG. 7Q. On the first gate conductive film 57, a second gate conductive film 58 is formed by the similar procedure as for producing the second gate conductive film 8 of Embodiment 1.

Figure 7R:
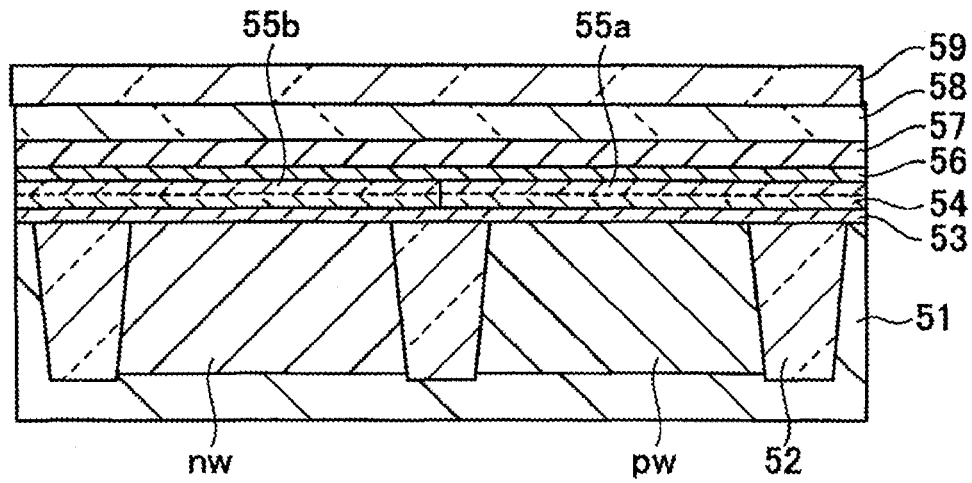

See FIG. 7R. On the second gate conductive film 58, a hard mask film 59 is formed by the similar procedure as for producing the hard mask film 9 of Embodiment 1.

Figure 7S:
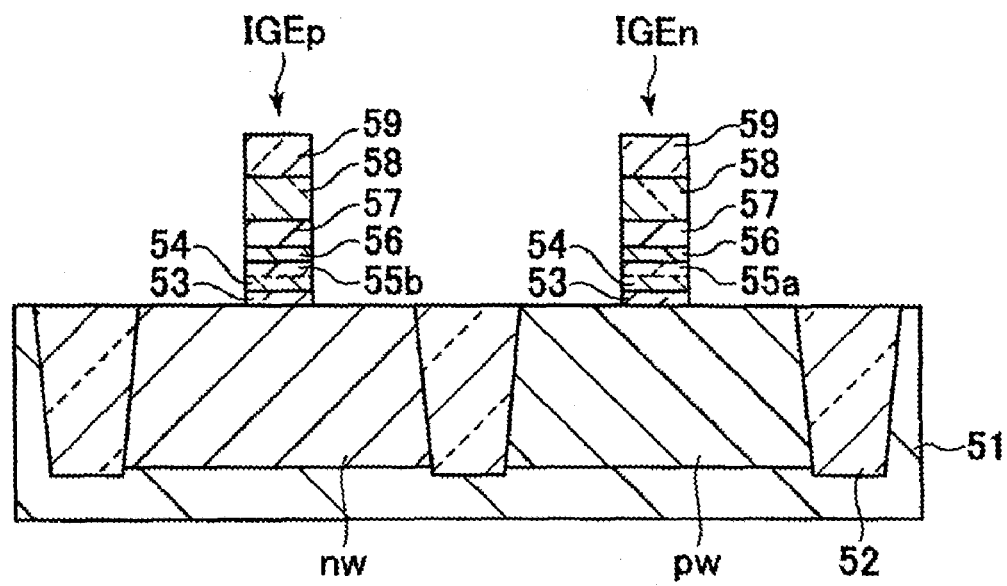

See FIG. 7S. The hard mask film 59, the second gate conductive film 58, the first gate conductive film 57, the tantalum nitride capping layer 56, the aluminum oxide capping layers 55a and 55b, the high dielectric constant insulating film 54, and the insulating film underlayer 53 are etched by the similar procedure as for producing the insulation gate electrode IGE of Embodiment 1, thereby forming the n-type MOS transistor's insulation gate electrode IGEn on the p-type well pw and the p-type MOS transistor's insulation gate electrode IGEp on the n-type well nw.

Figure 7T:
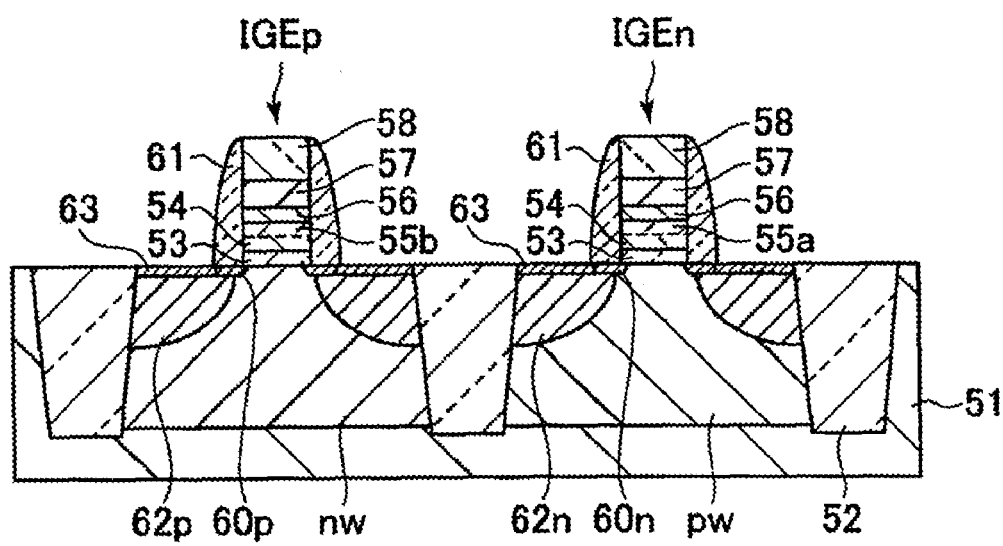
Figure 7U:
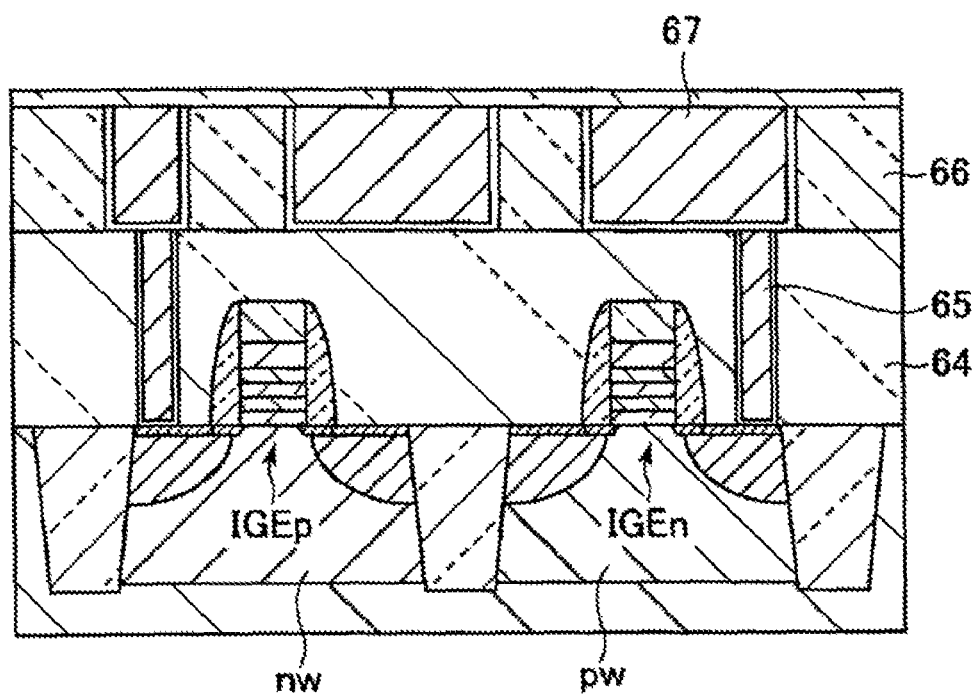

See FIG. 7T. Using the insulation gate electrode IGEn as mask, n-type impurities are injected into the p-type well pw to form low concentration portions 60n. Using the insulation gate electrode IGEp as mask, p-type impurities are injected into the n-type well nw to form low concentration portions 60p.

Then, the side wall spacer 61 is formed on the side face of the insulation gate electrodes IGEn and IGEp by the similar procedure as for producing the side wall spacer 11 of Embodiment 1. Using the insulation gate electrode IGEn and the side wall spacer 61 on its side face as mask, n-type impurities are injected into the p-type well pw to form high concentration source/drain portions 62n. Using the insulation gate electrode IGEp and the side wall spacer 61 on its side face as mask, p-type impurities are injected into the n-type well nw to form high concentration source/drain portions 62p.

Heat treatment is carried out to activate the impurities injected into the low concentration portions 60n and 60p and the high concentration source/drain portions 62n and 62p. For instance, RTA is carried out at a temperature above about 1,000° C. (for instance, at 1,050° C.). Silicide films 63 are formed over the surface of the high concentration source/drain portions 62n and 62p.

See FIG. 7U. An interlayer insulating film 64, contact plugs 65, an interlayer insulating film 66, and interconnects 67 are formed by the similar procedures as for producing the interlayer insulating film 14, the contact plug 15, the interlayer insulating film 16, and interconnect 17 of Embodiment 1. In addition, by one of the various generally known techniques, the upper interconnect structure may be formed to construct a multi-layered interconnect structure. In this way, a semiconductor device of Embodiment 2 is produced.

According to Embodiment 2, a low-oxygen aluminum oxide capping layer can be formed in the n-type MOS transistor region, while an aluminum oxide capping layer with the stoichiometric composition is formed separately in the p-type MOS transistor region.

In Embodiment 2, too, the annealing for impurity activation doubles as the heat treatment to be performed following the formation of the tantalum nitride capping layer as in Embodiment 1. Here, the heat treatment of the tantalum nitride capping layer may be performed in a separate step.

Here, the separate formation of the aluminum oxide capping layer for the n-type MOS transistor and that for the p-type MOS transistor is not limited to the method of Embodiment 2. Other methods for separate formation of aluminum oxide capping layers are described below as Embodiments 3 to 5.

Figure 8A:
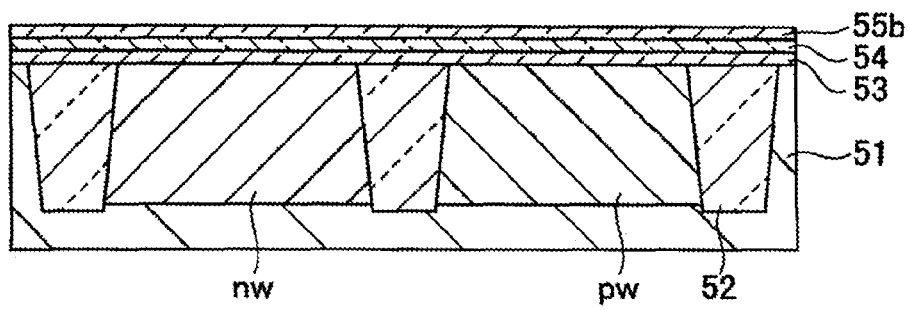
FIGS. 8A to 8C are schematic cross sections illustrating major steps of the CMOS transistor production method according to Embodiment 3.
Figure 8B:
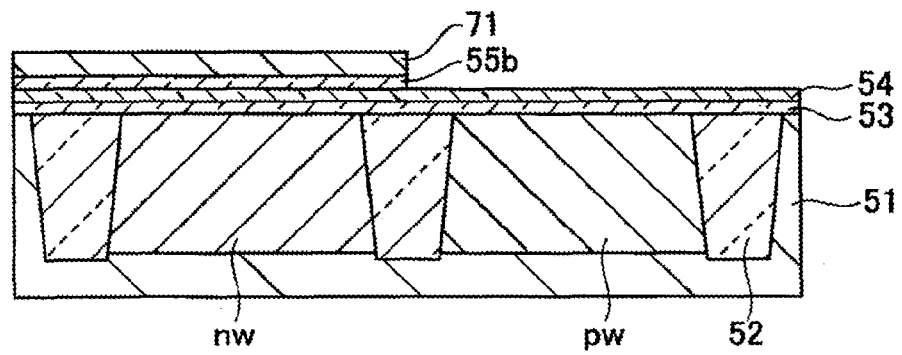
Figure 8C:
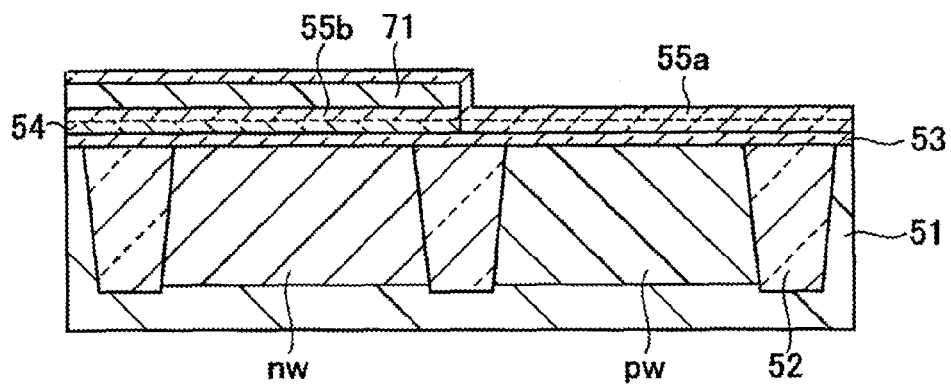

Embodiment 3 is described first. FIGS. 8A to 8C are schematic cross sections illustrating major steps of the CMOS transistor production method according to Embodiment 3. Other steps that are not illustrated in FIGS. 8A to 8C will be described with reference to figures for Embodiment 2. In describing Embodiment 3, the same numerals as used in Embodiment 2 are adopted for components that correspond clearly to their counterparts in Embodiment 2 (this also applies to Embodiments 4 and 5). First, the steps from the start to the formation of the high dielectric constant insulating film 54 are carried out as illustrated in FIGS. 7A to 7C of Embodiment 2.

See FIG. 8A. In Embodiment 2, a low-oxygen aluminum oxide capping layer 55a is formed over the entire face of the high dielectric constant insulating film 54 (see FIG. 7D), but in Embodiment 3, an aluminum oxide capping layer 55b with the stoichiometric composition is formed over the entire face of the high dielectric constant insulating film 54.

See FIG. 8B. By the similar procedures as for the steps illustrated in FIGS. 7E to 7K of Embodiment 2, masks including a hard mask film 71 are formed, and the aluminum oxide capping layer 55b with the stoichiometric composition is etched. In Embodiment 3, the masks including the hard mask film 71 cover the region where a p-type MOS transistor is to be formed while exposing the region where an n-type MOS transistor is to be formed, and the aluminum oxide capping layer 55b with the stoichiometric composition is removed in the n-type MOS transistor region.

See FIG. 8C. A low-oxygen aluminum oxide capping layer 55a is formed on the high dielectric constant insulating film 54 that is exposed in the n-type MOS transistor region. The low-oxygen aluminum oxide capping layer 55a extends over the hard mask film 71 in the p-type MOS transistor region. Mixing annealing is then carried out.

By carrying out the similar steps as described above with reference to FIG. 7N of Embodiment 2, the low-oxygen aluminum oxide capping layer 55a and the hard mask film 71 are removed from the p-type MOS transistor region. Subsequently, by carrying out the similar steps as described above with reference to FIGS. 7O to 7U of Embodiment 2, the steps for and after the formation of the tantalum nitride capping layer 56 are performed to produce CMOS transistors.

In Embodiment 3 as well, separate aluminum oxide capping layers can be formed for the n-type MOS transistor and the p-type MOS transistor.

Here, as illustrated in FIG. 8C, mixing annealing in Embodiment 3 is carried out in a state where the low-oxygen aluminum oxide capping layer 55a is exposed in the n-type MOS transistor region. In the case where the production apparatus for the low-oxygen aluminum oxide capping layer 55a and the heat treatment apparatus for the mixing annealing are not connected through a vacuum conveyance system, the low-oxygen aluminum oxide capping layer 55a can be oxidized after being exposed to the atmosphere.

To prevent oxidation of the low-oxygen aluminum oxide capping layer 55a, it is desirable to form the low-oxygen aluminum oxide capping layer 55a first, and the mixing annealing step is carried out after covering it (with the hard mask film 71) as in Embodiment 2.

Embodiment 4 is described below. FIGS. 9A to 9F are schematic cross sections illustrating major steps of the CMOS transistor production method according to Embodiment 4. The steps other than those given in FIGS. 9A to 9F are described with reference to figures for Embodiment 2. By carrying out the similar steps as illustrated in FIGS. 7A to 7D of Embodiment 2, the layers up to the low-oxygen aluminum oxide capping layer 55a are formed.

Figure 9A:
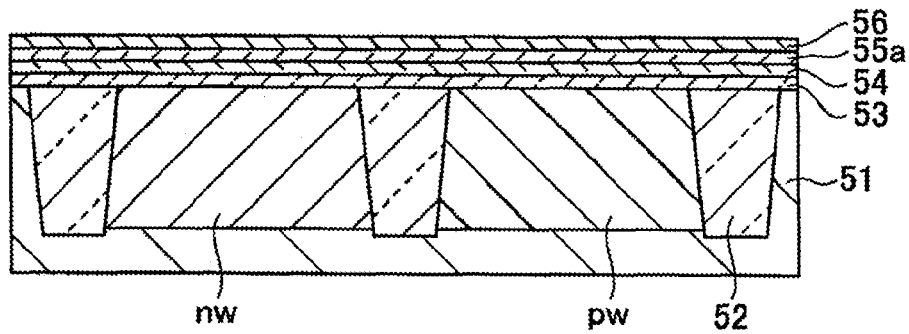

See FIG. 9A. A tantalum nitride capping layer 56 is formed on the low-oxygen aluminum oxide capping layer 55a.

Figure 9B:
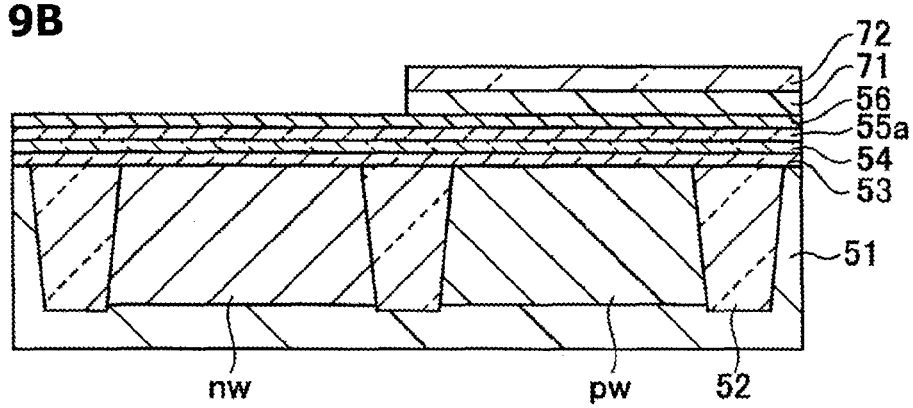

See FIG. 9B. By carrying out the similar steps as described with reference to FIGS. 7E to 7I of Embodiment 2, masks composed of the hard mask films 72 and 71 is formed on the tantalum nitride capping layer 56. The region for n-type MOS transistor formation is covered by the masks composed of the hard mask films 72 and 71, while the tantalum nitride capping layer 56 in the region for p-type MOS transistor formation is exposed.

Figure 9C:
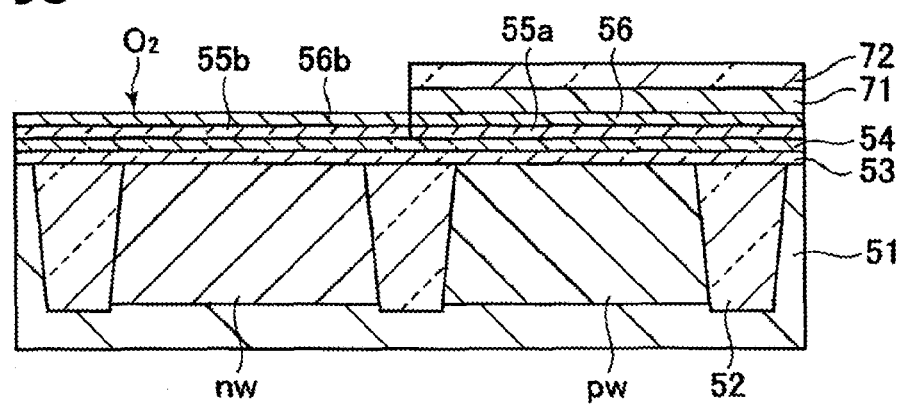

See FIG. 9C. The tantalum nitride capping layer 56 exposed in the p-type MOS transistor region and the low-oxygen aluminum oxide capping layer 55a existing below it are oxidized. This oxidization step is carried out in, for instance, an Ar-based atmosphere containing $O_2$ up to 0.1% to 1% under the conditions of 0.1 Pa to 10 Pa and 400° C. to 700° C. It is desirable for the oxidization step to be performed under the conditions of, for instance, an $O_2$ concentration of 0.1%, 1 Pa, and 400° C. to prevent the insulating film underlayer 53 in the p-type MOS transistor region from being enlarged as a result of the oxidization.

This oxidization step converts the tantalum nitride capping layer 56 in the p-type MOS transistor region into a tantalum oxynitride capping layer 56b, and converts the low-oxygen aluminum oxide capping layer 55a in the p-type MOS transistor region into an aluminum oxide capping layer 55b with the stoichiometric composition.

See FIG. 9D. Mixing annealing is carried out.

See FIG. 9E. The hard mask film 72 of, for instance, silicon nitride is removed by, for instance, treatment with diluted hydrofluoric acid and rinsing in water, and the hard mask film 71 of, for instance, titanium nitride is removed by, for instance, treatment with hydrogen peroxide solution and rinsing in water.

See FIG. 9F. A first gate conductive film 57 and a second gate conductive film 58 are formed on the tantalum nitride capping layer 56 and the tantalum oxynitride capping layer 56b. Then, the hard mask film 59 is formed on the second gate conductive film 58.

Subsequently, by carrying out the similar steps as described with reference to FIGS. 7S to 7U of Embodiment 2, the patterning of the insulation gate electrode and the following steps are carried out to produce CMOS transistors.

According to Embodiment 4 as well, separate aluminum oxide capping layers can be formed for the n-type MOS transistor and the p-type MOS transistor.

In Embodiment 4, the tantalum nitride capping layer 56 is oxidized in the p-type MOS transistor region. As the migration of oxygen vacancies from the tantalum oxynitride capping layer into the aluminum oxide capping layer with the stoichiometric composition is considered a factor in the positive shift in the threshold voltage, it is expected that even the method of Embodiment 4 can bring about a positive shift in the threshold voltage in the p-type MOS transistor.

In Embodiment 4, mixing annealing is performed after the formation of the tantalum nitride capping layer 56 and the tantalum oxynitride capping layer 56b. This mixing annealing can doubles as the heat treatment intended to allow the tantalum nitride capping layer to act to increase the threshold voltage shift.

Figure 10A:
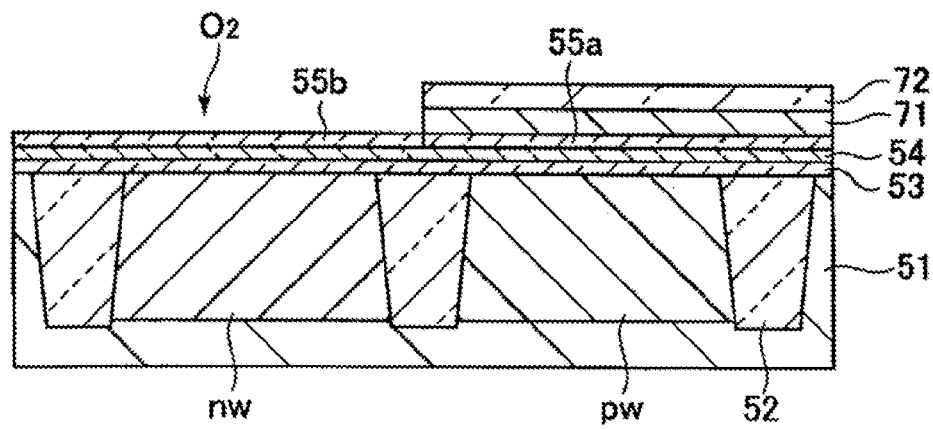
FIGS. 10A and 10B are schematic cross sections illustrating major steps of the CMOS transistor production method according to Embodiment 5.
Figure 10B:
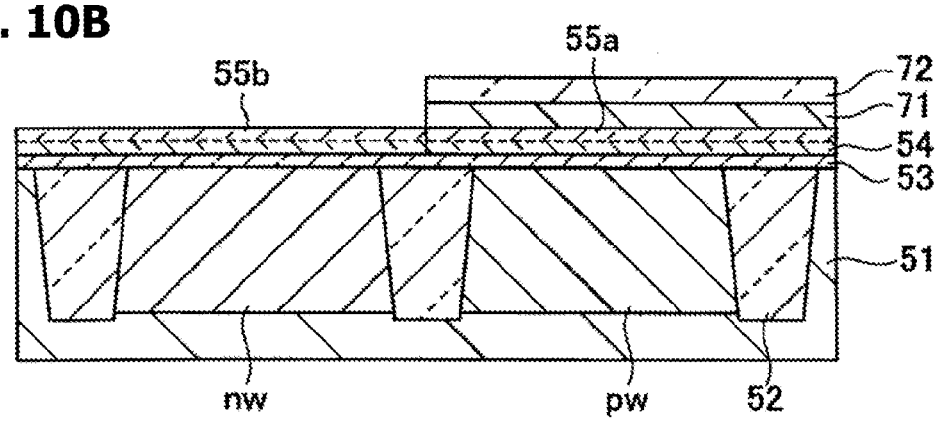

Embodiment 5 is described next. FIGS. 10A and 10B are schematic cross sections illustrating major steps of the CMOS transistor production method according to Embodiment 5. The steps other than those given in FIGS. 10A and 10B are described with reference to figures for Embodiment 2. By carrying out the similar steps as illustrated in FIGS. 7A to 7D of Embodiment 2, the layers up to the low-oxygen aluminum oxide capping layer 55a are formed.

In addition, by carrying out the similar steps as described with reference to FIGS. 7E to 7I of Embodiment 2, masks composed of the hard mask films 72 and 71 are formed on the low-oxygen aluminum oxide capping layer 55a.

See FIG. 10A. The region for n-type MOS transistor formation is covered by the masks composed of the hard mask films 72 and 71, while the low-oxygen aluminum oxide capping layer 55a in the p-type MOS transistor region is exposed.

Then, the low-oxygen aluminum oxide capping layer 55a in the p-type MOS transistor region is oxidized into an aluminum oxide capping layer 55b with the stoichiometric composition. This oxidization step is carried out in, for instance, an Ar-based atmosphere containing $O_2$ up to 0.1% to 1% under the conditions of 0.1 Pa to 10 Pa and 400° C. to 700° C. It is desirable for the oxidization step to be performed under the conditions of, for instance, an $O_2$ concentration of 0.1%, 1 Pa, and 400° C. to prevent the insulating film underlayer 53 in the p-type MOS transistor region from being enlarged as a result of the oxidization.

See FIG. 10B. Mixing annealing is carried out.

Subsequently, the similar step as described with reference to FIG. 9E of Embodiment 3 are carried out to remove the hard mask films 72 and the hard mask film 71, and the similar steps as described with reference to FIGS. 7O to 7U of Embodiment 2 are carried out to perform the formation of the tantalum nitride capping layer 56 and subsequent steps to produce CMOS transistors.

In Embodiment 5 as well, separate aluminum oxide capping layers can be formed for the n-type MOS transistor and the p-type MOS transistor.

When CMOS transistors are formed as in Embodiments 2 to 5, an aluminum oxide capping layer of aluminum oxide with a lower oxygen content than the stoichiometric composition is formed in the n-type MOS transistor region, and an aluminum oxide capping layer of aluminum oxide with a higher oxygen content than the aluminum oxide in the aluminum oxide capping layer in the n-type MOS transistor region is formed in the p-type MOS transistor region.

When completing the CMOS transistors, mixing annealing is carried out after the formation of an aluminum oxide capping layer in the p-type MOS transistor region. The annealing for impurity activation can double as this mixing annealing if it can provide sufficient heat required for mixing annealing. The heat treatment intended to allow the tantalum nitride capping layer to cause a shift in the threshold voltage also can double as mixing annealing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device production method comprising:
    forming a gate insulating film on a p-type region of a semiconductor substrate;
    forming a first aluminum oxide film on said gate insulating film, the first aluminum oxide film having an oxygen composition ratio to aluminum in a range of 0.7 to 1.2;
    forming a tantalum-nitrogen-containing film that contains tantalum and nitrogen on said first aluminum oxide film;
    forming an electrically conductive film on said tantalum-nitrogen-containing film;
    patterning said electrically conductive film to form a gate electrode;
    injecting n-type impurities into said p-type region using said gate electrode as a mask; and
    carrying out heat treatment after the formation of the tantalum-nitrogen-containing film.

2. A semiconductor device production method according to claim 1 wherein said forming a first aluminum oxide film comprises forming said first aluminum oxide film by atomic layer deposition.

3. A semiconductor device production method according to claim 1 wherein said forming a tantalum-nitrogen-containing film comprises forming a TaN film as said tantalum-nitrogen-containing film.

4. A semiconductor device production method according to claim 1 wherein said carrying out heat treatment comprises carrying out said heat treatment in the range of 850° C. to 1,100° C.

5. A semiconductor device production method according to claim 1 wherein said carrying out heat treatment is performed after said injecting said n-type impurity and doubles as annealing for impurity activation.

6. A semiconductor device production method comprising:
    forming a first gate insulating film on a p-type region of a semiconductor substrate and a second gate insulating film on an n-type region of said semiconductor substrate;
    forming a first aluminum oxide film with a first oxygen composition ratio to aluminum lower than an oxygen composition ratio to aluminum of $Al_2O_3$, on said first gate insulating film on said p-type region;
    forming a second aluminum oxide film with a second oxygen composition ratio to aluminum higher than said first oxygen composition ratio, on said second gate insulating film on said n-type region;
    forming a tantalum-nitrogen-containing film that contains tantalum and nitrogen on said first aluminum oxide film and said second aluminum oxide film;
    forming an electrically conductive film on said tantalum-nitrogen-containing film;
    patterning said electrically conductive film to form a first gate electrode above said p-type region and a second gate electrode above said n-type region;
    injecting n-type impurities into said p-type region using said first gate electrode as a mask;
    injecting p-type impurities into said n-type region using said second gate electrode as a mask; and
    carrying out heat treatment after the formation of said tantalum-nitrogen-containing film.

7. A semiconductor device production method according to claim 6 wherein:
    said forming a first aluminum oxide film comprises forming said first aluminum oxide film on said first gate insulating film on said p-type region and on said second gate insulating film on said n-type region, and
    etching said first aluminum oxide film above said n-type region using a mask that covers said p-type region and exposes said n-type region, and
    said forming a second aluminum oxide film comprises forming said second aluminum oxide film on said second gate insulating film on said n-type region that is exposed by said etching said first aluminum oxide film above said n-type region.

8. A semiconductor device production method according to claim 7 further comprising carrying out mixing annealing after the formation of said second aluminum oxide film, with said first aluminum oxide film covered by said mask.

9. A semiconductor device production method according to claim 6 wherein:
said forming a second aluminum oxide film comprises forming said second aluminum oxide film on said second gate insulating film on said n-type region and on said first gate insulating film on said p-type region, and
etching said second aluminum oxide film above said p-type region using a mask that covers said n-type region and exposes said p-type region, and
said forming a first aluminum oxide film comprises forming said first aluminum oxide film on said first gate insulating film on said p-type region that is exposed by said etching said second aluminum oxide film above said p-type region.

10. A semiconductor device production method according to claim 6 wherein:
said forming a first aluminum oxide film comprises forming said first aluminum oxide film on said first gate insulating film on said p-type region and on said second gate insulating film on said n-type region, and
said forming a second aluminum oxide film comprises forming said second aluminum oxide film by oxidizing said first aluminum oxide film above said n-type region using a mask that covers said p-type region and exposes said n-type region.

11. A semiconductor device production method according to claim 6 wherein said forming a first aluminum oxide film comprises forming said first aluminum oxide film with said first oxygen composition ratio to aluminum in a range of 0.7 to 1.2.

12. A semiconductor device production method according to claim 11 wherein said forming a second aluminum oxide film comprises forming said second aluminum oxide film with said second oxygen composition ratio to aluminum in a range of 1.4 to 1.6.

13. A semiconductor device production method according to claim 6 wherein said forming a first aluminum oxide film comprises forming said first aluminum oxide film by atomic layer deposition.

14. A semiconductor device production method according to claim 6 wherein said forming a second aluminum oxide film comprises forming said second aluminum oxide film by atomic layer deposition.

15. A semiconductor device production method according to claim 6 wherein said forming a tantalum-nitrogen-containing film comprises forming a TaN film as said tantalum-nitrogen-containing film.

16. A semiconductor device production method according to claim 6 wherein said carrying out heat treatment comprises carrying out said heat treatment in the range of 850° C. to 1,100° C.

17. A semiconductor device production method according to claim 6 wherein said carrying out heat treatment is performed after said injecting said n-type impurity and doubles as annealing for impurity activation.

18. A semiconductor device production method according to claim 6 further comprising carrying out mixing annealing after said forming said second aluminum oxide film and before said carrying out heat treatment.

19. A semiconductor device production method comprising:
forming a first gate insulating film on a p-type region of a semiconductor substrate and a second gate insulating film on an n-type region of said semiconductor substrate;
forming a first aluminum oxide film with a first oxygen composition ratio to aluminum lower than an oxygen composition ratio to aluminum of $Al_2O_3$, on said first gate insulating film on said p-type region and on said second gate insulating film on said n-type region;
forming a tantalum-nitrogen-containing film that contains tantalum and nitrogen on said first aluminum oxide film;
forming a second aluminum oxide film with a second oxygen composition ratio to aluminum higher than said first oxygen composition ration, on said second gate insulating film above said n-type region and forming an oxidized tantalum-nitrogen-containing film on said second aluminum oxide film, by oxidizing said tantalum-nitrogen-containing film and said first aluminum oxide film above said n-type region using a mask that covers said p-type region and exposes said n-type region;
forming an electrically conductive film on said tantalum-nitrogen-containing film and said oxidized tantalum-nitrogen-containing film;
patterning said electrically conductive film to form a first gate electrode above said p-type region and a second gate electrode above said n-type region;
injecting n-type impurities into said p-type region using said first gate electrode as a mask;
injecting p-type impurities into said n-type region using said second gate electrode as a mask; and
carrying out heat treatment after the formation of said tantalum-nitrogen-containing film and said oxidized tantalum-nitrogen-containing film.

20. A semiconductor device production method according to claim 19 wherein said forming a first aluminum oxide film comprises forming said first aluminum oxide film with said first oxygen composition ratio to aluminum in a range of 0.7 to 1.2.

* * * * *